(12) United States Patent
McArthur et al.

(10) Patent No.: US 7,099,011 B2
(45) Date of Patent: *Aug. 29, 2006

(54) METHOD AND APPARATUS FOR SELF-REFERENCED PROJECTION LENS DISTORTION MAPPING

(75) Inventors: Bruce McArthur, San Diego, CA (US); Adlai Smith, Escondido, CA (US); Robert Hunter, Jr., San Diego, CA (US)

(73) Assignee: Litel Instruments, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/727,018

(22) Filed: Dec. 2, 2003

(65) Prior Publication Data
US 2005/0117154 A1   Jun. 2, 2005

Related U.S. Application Data

(63) Continuation-in-part of application No. 10/434,975, filed on May 9, 2003, now abandoned, which is a continuation of application No. 09/835,201, filed on Apr. 13, 2001, now Pat. No. 6,573,986.

(60) Provisional application No. 60/254,271, filed on Dec. 8, 2000.

(51) Int. Cl.
*G01B 11/00* (2006.01)
*G01B 9/00* (2006.01)
*G03F 9/00* (2006.01)
*G03B 27/42* (2006.01)
*G03B 27/32* (2006.01)

(52) U.S. Cl. .................... 356/401; 356/124; 430/22; 355/53; 355/77

(58) Field of Classification Search ................ 356/124, 356/399–401; 355/53, 55, 77; 430/5, 22, 430/30; 250/548
See application file for complete search history.

(56) References Cited

U.S. PATENT DOCUMENTS

| | | | |
|---|---|---|---|
| 4,861,148 A | 8/1989 | Sato et al. | 350/505 |
| 5,285,236 A | 2/1994 | Jain | 355/53 |
| 5,402,224 A | 3/1995 | Hirukawa et al. | 356/124 |
| 5,438,413 A | 8/1995 | Mazor et al. | 356/363 |
| 5,615,006 A * | 3/1997 | Hirukawa et al. | 356/124 |
| 5,757,507 A | 5/1998 | Ausschnitt et al. | 356/401 |
| 5,877,861 A | 3/1999 | Ausschnitt et al. | 356/401 |
| 5,894,350 A | 4/1999 | Hsieh et al. | 356/399 |
| 6,061,119 A * | 5/2000 | Ota | 355/53 |
| 6,079,256 A | 6/2000 | Bareket | 73/105 |

(Continued)

FOREIGN PATENT DOCUMENTS

JP    08078309 A  *  3/1996

OTHER PUBLICATIONS

Armitage Jr., J.D. and Kirk, J.P., "Analysis of overlay distortion patterns", *SPIE*, 921:207-222, (1998).

(Continued)

*Primary Examiner*—Hoa Q. Pham
*Assistant Examiner*—Gordon J. Stock, Jr.

(57) ABSTRACT

A projection lens distortion error map is created using overlay targets and a special numerical algorithm. A reticle including an array of overlay targets is exposed several times onto a photoresist coated silicon wafer using a photolithographic stepper. After exposure, the overlay targets are measured for placement error. The resulting overlay error data is then supplied to a software program that generates a lens distortion error map for the photolithographic projection system.

27 Claims, 32 Drawing Sheets

U.S. PATENT DOCUMENTS

| | | | | |
|---|---|---|---|---|
| 6,143,621 | A | 11/2000 | Tzeng et al. | 438/401 |
| 6,259,525 | B1 | 7/2001 | David | 356/399 |
| 6,437,858 | B1* | 8/2002 | Kouno et al. | 356/124 |
| 6,573,986 | B1* | 6/2003 | Smith et al. | 356/124 |
| 6,633,390 | B1* | 10/2003 | Shiode et al. | 356/620 |
| 6,646,729 | B1* | 11/2003 | van der Laan et al. | 356/124 |
| 6,753,954 | B1* | 6/2004 | Chen | 356/124 |
| 2004/0233402 | A1* | 11/2004 | Smith | 355/52 |

OTHER PUBLICATIONS

Bjorkholm et al., "Reduction imaging at 14 nm using multilayer-coated optics: printing of features smaller than 0.1 μm", *J. Vac. Sci. Technol.B.*, 8(6):1509-1543, (1990).

Brunner, T.A., "Impact Of Lens Aberrations On Optical Lithography", *IBM Journal of Research and Development: Optical Lithography* 41(1-2):57-67, (1997) (http://www.research.ibm.com/journal/rd/411/brunner.html).

Bruning et al., "Optical Lithography—Thirty years and three orders of magnitude"*SPIE*, 3051:14-27, (1997).

Cote et al., "Micrascan™ III-performance of a third generation, catadioptric step and scan lithographic tool", *SPIE*, 3051:806-816, (1997).

DeJule, R., "Mix-and Match: A Necessary Choice", *Semiconductor International*, 23(2): 66-76, (Feb. 2000).

Dooly, T. and Yang, Y., "Stepper matching for optimum line performance", *SPIE*, 3051:426-432, (1997).

Goodwin, F. and Pellegrini, J.C., "Characterizing Overlay Registration of Concentric 5X and 1X Stepper Exposure Fields using Interfield Data", *SPIE*, 3050:407-417, (1997).

*Handbook of Microlithography, Micromachining, and Microfabrication*, Book: vol. 1, "Microlithography", Rai-Choudhury, P. (Ed.), SPIE Optical Engineering Press, SPIE, Bellingham, Washington, pp. 417-418, (1997).

Hasan et al., "Automated Electrical measurements of Registration Errors in Step-and-Repeat optical Lithography Systems", *IEEE Transactions on Electron Devices*, ED27(12):2304-2312, (1980).

Kemp et al., "A "golden standard" wafer design for optical stepper characterization", *SPIE*, 1464:260-266, (1991).

KLA 5105, "Linewidth and Misregistration System", KLA 5105 Product Specifications, *KLA Instruments Corporation*, 2 pages, (1995).

KLA 5200, "Value-added Overlay Metrology for Advanced Lithography", KLA 5200 Product Specifications, *KLA Instruments Corporation*, 2 pages, (1996).

Kodama, K. and Matsubara, E., "Measuring system XY-5i", *SPIE*, 2439:144-155, (1995).

Leica LMS IPRO, "Fully automated mask and wafer metrology system", *Leica*, pamphlet pp. 1-5.

Lin, B.J., "The Attenuated Phase-Shifting Mask", *Solid State Technology*, Special Series/Advanced Lithography; 35(1):43-47, (Jan., 1992).

MacMillen, D. and Ryden, W.D., "Analysis of image field placement of a 5X microlithographic reduction lens", *SPIE*, 334:78-89, (1982).

Martin et al., "Measuring Fab Overlay Programs",*SPIE*, 3677:64-71(1999).

Mc Fadden, E.A. and Ausschnitt, C.P., "A Computer Aided Engineering Workstation For Registration Control", *SPIE*, 1087:255-266, (1989).

Mulkens et al., "ArF Step And Scan Exposure System For 0.15 μm Technology Node?"; *SPIE*, 3679:506-521, (1999).

Newnam, B.E. and Viswanathan, V.K., "Development of XUV projection lithograph at 60-80 nm", *SPIE*, 1671:419-436, (1992).

*Numerical Recipes*, "The Art of Scientific Computing", Press et al. (Eds.), Cambridge University Press, New York, pp. 52-64 (1990).

Pellegrini, J.C., "Comparisons of Six Different Intrafield Control Paradigms in an Advanced Mix-and-Match Environment", *SPIE*, 3050:398-406, (1997).

Pellegrini et al., "Super Sparse Overlay Sampling Plans: An Evaluation of Methods and Algorithms for Optimizing Overlay Quality Control and Metrology Tool Throughput",*SPIE*, 3677:72-82, (1999).

Preil, M.E. and McCormack, J.F.M., "A New Approach to Correlating Overlay and Yield",*SPIE*, 3677:208-216, (1999).

Quaestor Q7, "Fully Automated Optical Metrology System for Advanced IC Production", Quaestor Q7 Product Specification, *BIO -RAD*, 2 pages.

Raugh, M.R., "Error estimation for lattice methods of stage self-calibration", *SPIE*, 3050:614-625, (1997).

Sullivan, N.T., "Semiconductor Pattern Overlay", *SPIE Critical Reviews of Optical Science and Technology*, CR52:160-188, (1994).

Takac et al., "Self-calibration in two-dimensions: the experiment",*SPIE*, 2725:130-146, (1996).

van den Brink et al., "Direct-referencing automatic two-points reticle-to-wafer alignment using a projection column servo system", *SPIE*, 633:60-71, (1986).

van den Brink et al., "Matching Management Of Multiple Wafer Steppers Using A Stable Standard And A Matching Simulator", *SPIE*, 1087:218-232, (1989).

van den Brink et al., "Matching Of Multiple Wafer Steppers For 0.35 μm Lithography Using Advanced Optimization Schemes", *SPIE*, 1926:188-207 (1993).

van den Brink et al., "Matching Performance For Multiple Wafer Steppers Using An Advanced Metrology Procedure", *SPIE*, 921:180-197, (1988).

van den Brink et al., "New 0.54 Aperture i-Line Wafer Stepper With Field By Field Leveling Combined With Global Alignment", *SPIE*, 1463:709-724, (1991).

van Schoot et al., "0.7 NA DUV Step & Scan Systems For 150nm Imaging With Improved Overlay", *SPIE*, 3679:448-463, (1999).

Yost, A. and Wu, W., "Lens matching and distortion testing in a multi-stepper, sub-micron environment", *SPIE*, 1087:233-244, (1989).

Zavecz et al., "Life Beyond Mix-and-Match: Controlling Sub-0.18 μm Overlay Errors", *Semiconductor International*, 23(8):205,206,208,210,212 and 214, (Jul. 2000).

Zavecz, T.E., "Machine Models and Registration", *SPIE Critical Reviews of Optical Science and Technology*, CR52:134-159 (1994).

\* cited by examiner

Schematics for FIG. 1
Reticle Features
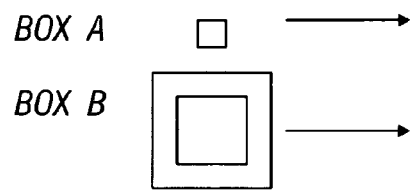
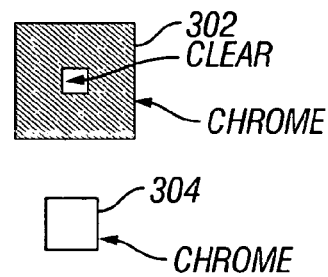
BOX A
BOX B
302
CLEAR
CHROME
304
CHROME
FIG. 2
(Prior Art)
FIG. 3
(Prior Art)
Overlapping regions
Perfectly centered Box-in-Box structure
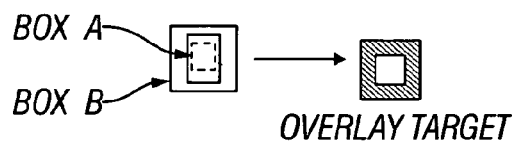
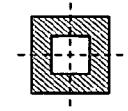
BOX A
BOX B
OVERLAY TARGET
FIG. 4
(Prior Art)
FIG. 4A
(Prior Art)

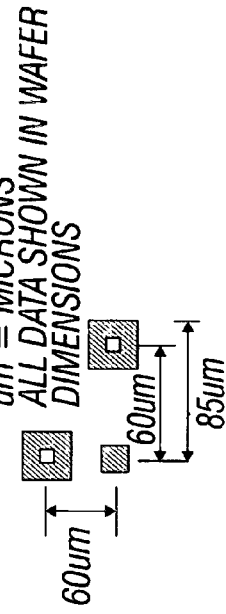

FIG. 5 Schematic for outer box 2

FIG. 6 Outer box 2 as printed on wafer. Dark=unexposed, white=exposed

FIG. 7 Schematic for inner box 1

FIG. 8 Inner box 1 as printed on wafer. Dark=unexposed, white=exposed

FIG. 9 Schematic for 2-dimensional 4XOL reticle

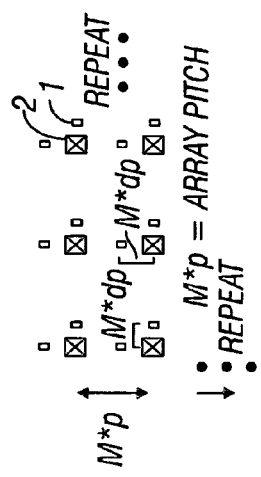

FIG. 10 Typical 4XOL reticle overlay set as projected onto wafer (3 featured parts); dark=unexposed, white=exposed. um = MICRONS. ALL DATA SHOWN IN WAFER DIMENSIONS

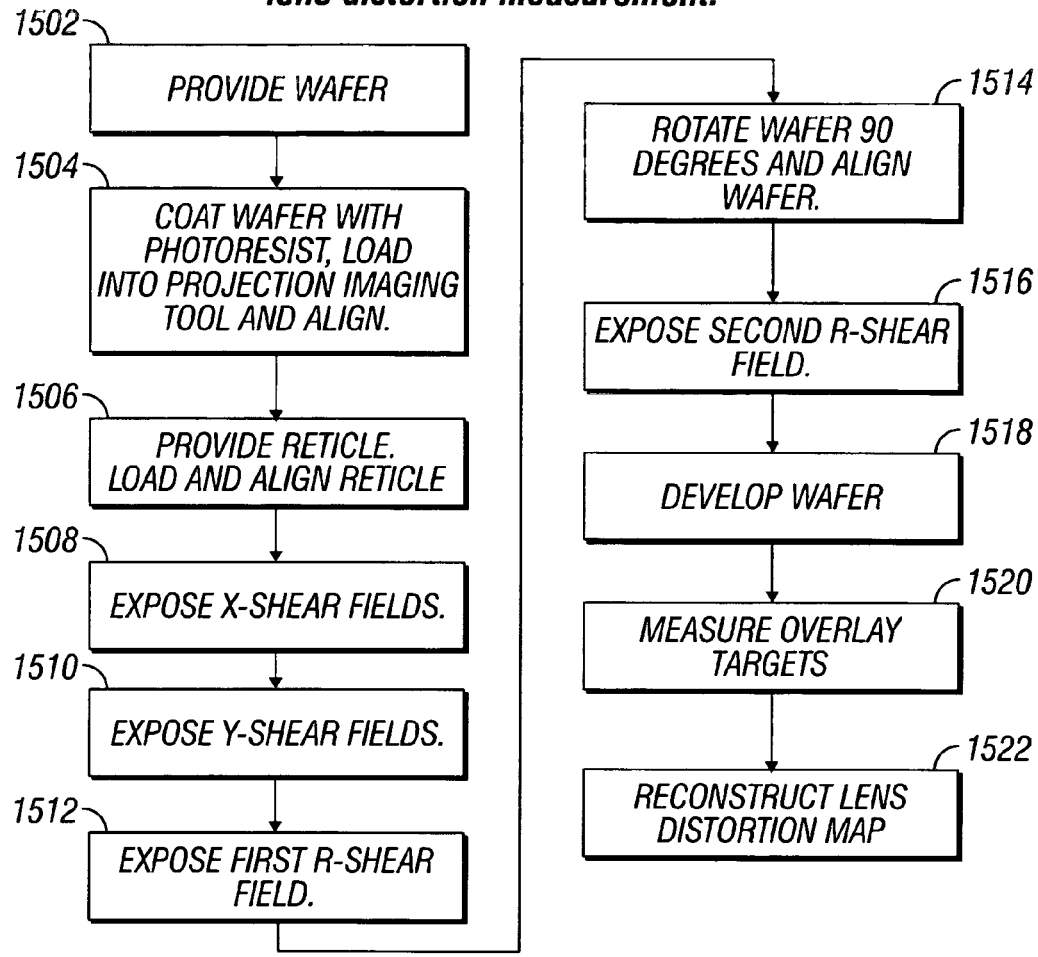
FIG. 15
*Some components of overlay or placement error (Inter-field and Intra-field)*
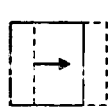        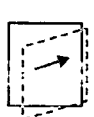    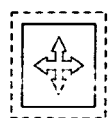
TRANSLATION    ROTATION    NON-ORTHOGONALITY    SCALE OR MAGNIFICATION
FIG. 16

*Side view of reticle of FIG. 20*

*Intra-field indices projected onto the wafer*

Wafer with alignment marks at 0 and 90 degrees

Wafer after exposure of FIG. 20 overlay reticle at the 0 degree orientation

Wafer after exposure of FIG. 20 overlay reticle at the 0 and 90 degree orientations (clockwise)

Detail of R-shear pattern on wafer

Closeup of overlay groups for R-shear

**Single Box-in-Box target.
Dark = undeveloped photoresist
white = no photoresist**

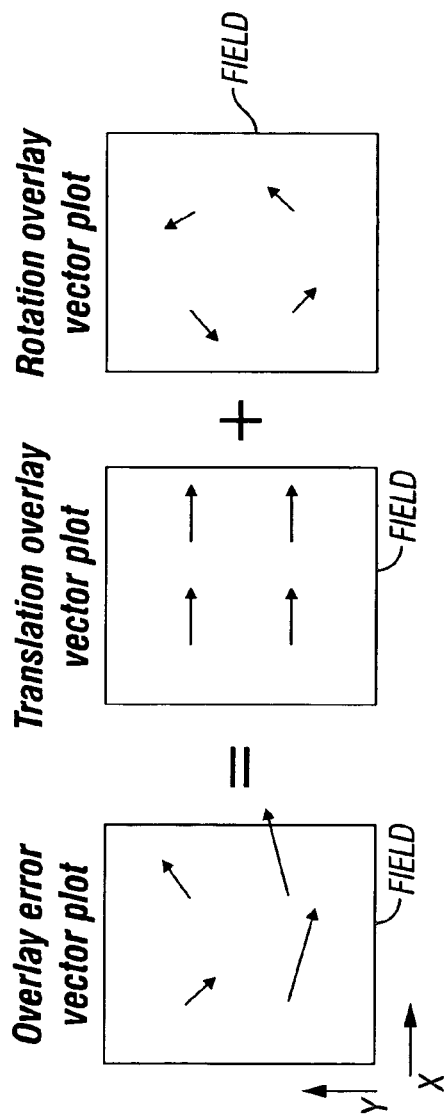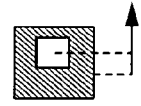
FIG. 30 (Prior Art)
FIG. 29 (Prior Art)
FIG. 28 (Prior Art)
Overlay measurement
THE VECTOR REPRESENTS THE ALIGNMENT OFFSET DISTANCE BETWEEN THE BOX-IN-BOX STRUCTURE
FIG. 31 (Prior Art)

Inner box 3 on reticle.
Dark=chrome,
white=open.

Outer box 4 on reticle.
Dark=chrome,
white=open.

Wafer after exposure of FIG. 20 overlay reticle for X and Y shears.

FINAL RESULTS OF THE METHOD OF THIS INVENTION.
UNITS=MICRONS, (xf,yf) = INTRA-FIELD LOCATION,
(dxf, dyf) = INTRA-FIELD DISTORTION AT POINT (xf, yf).

Machine id: DUVF11-02

| Xf | yf | dxf | dyf |
|---|---|---|---|
| -10000.000 | -10000.000 | -0.139 | 0.044 |
| -8000.000 | -10000.000 | 0.223 | -0.233 |
| -6000.000 | -10000.000 | 0.498 | 0.004 |
| ⋮ | ⋮ | ⋮ | ⋮ |
| 10000.000 | 10000.000 | 0.099 | -0.188 |

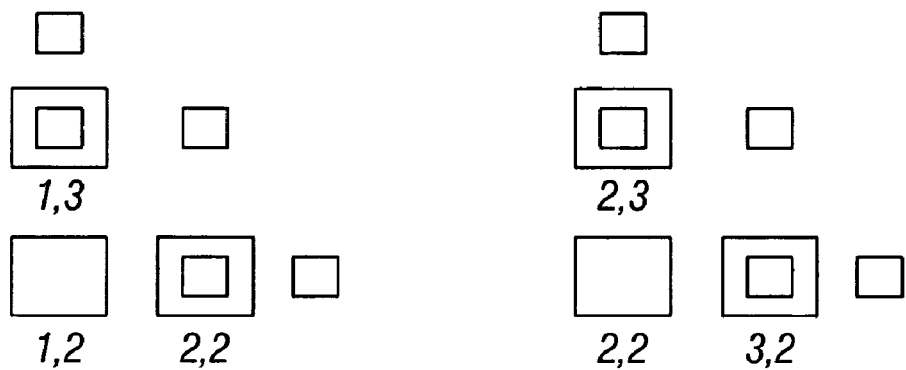
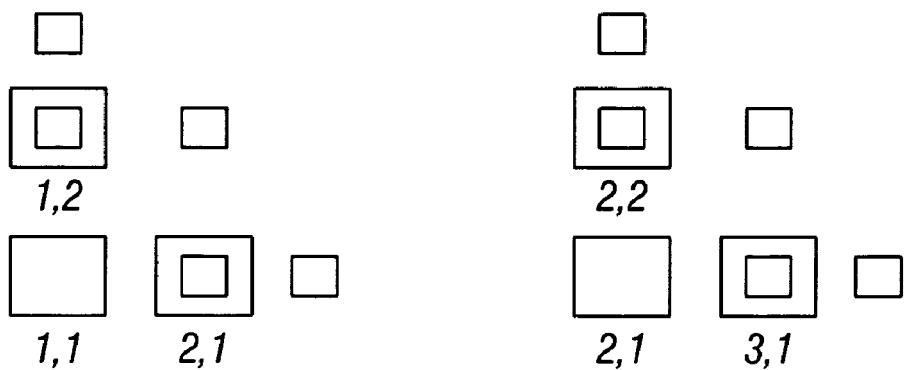
FIG. 48

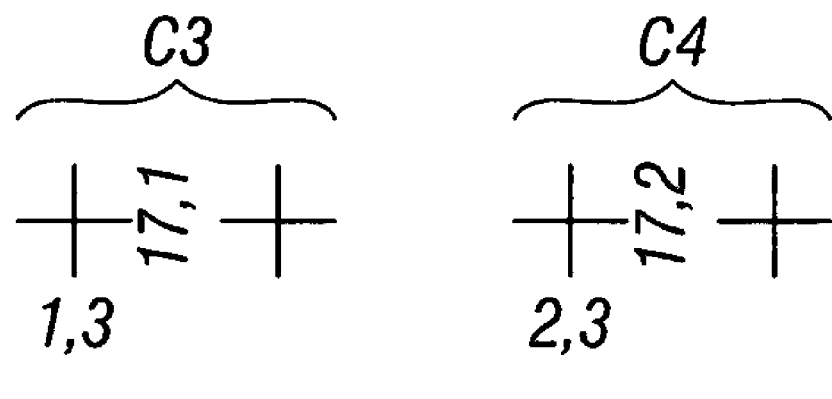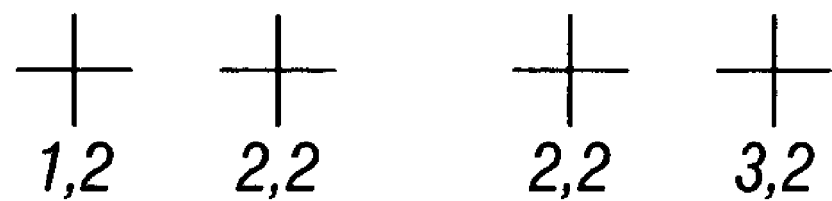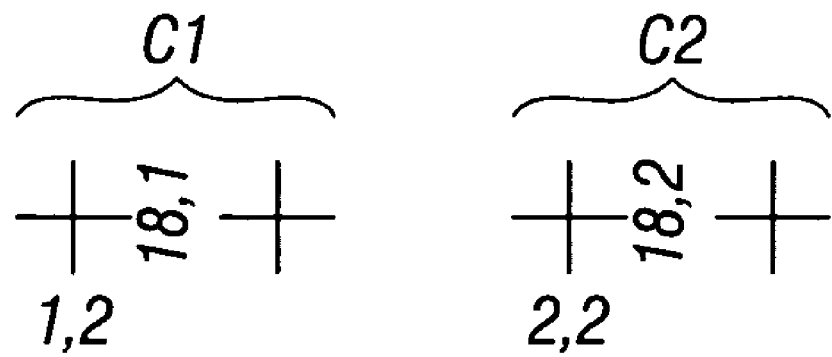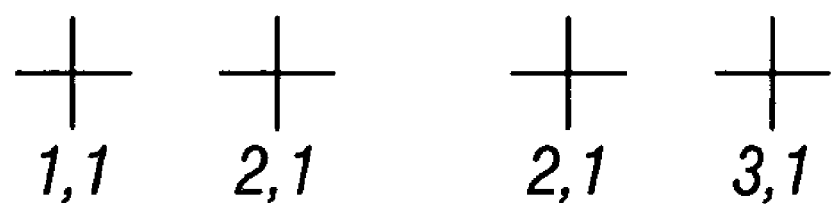
FIG. 49

FINAL RESULT FOR COMPUTATION OF x AND y TILT.
(xf,yf) = INTRA-FIELD LOCATION IN MICRONS
(a2, a3) = (x,y) TILT IN RADIANS

Machine id: DUVF11-03

| xf | yf | a2 | a3 |
|---|---|---|---|
| -10000 | -10000 | -0.15 | 0.06 |
| -8000 | -10000 | -0.17 | -0.42 |
| -6000 | -10000 | -0.38 | -0.01 |
| ⋮ | ⋮ | | |
| 10000 | 10000 | 0.11 | -0.08 |

FIG. 51

METHOD AND APPARATUS FOR SELF-REFERENCED PROJECTION LENS DISTORTION MAPPING

REFERENCE TO PRIORITY DOCUMENT

This application is a continuation-in-part of U.S. application Ser. No. 10/434,975 filed on May 9, 2003 now abandoned, which is a continuation of U.S. application Ser. No. 09/835,201 (now U.S. Pat. No. 6,573,986 issued on Jun. 3, 2003) filed on Apr. 13, 2001, which claims priority from U.S. Provisional Application No. 60/254,271 filed on Dec. 8, 2000.

BACKGROUND

1. Field of the Invention

The present invention relates generally to optical metrology and more particularly to characterizing and monitoring the intra-field distortions of projection imaging systems used in semiconductor manufacturing.

2. Description of the Related Art

Today's lithographic processing requires ever tighter layer-to-layer overlay tolerances to meet device performance requirements. Overlay registration is defined as the translational error that exists between features exposed layer to layer in the vertical fabrication process of semiconductor devices on silicon wafers. Other names for overlay registration include, registration error and pattern placement error, and overlay error. Overlay registration on critical layers can directly impact device performance, yield and repeatability. Increasing device densities, decreasing device feature sizes and greater overall device size conspire to make pattern overlay one of the most important performance issues during the semiconductor manufacturing process. The ability to accurately determine correctable and uncorrectable pattern placement error depends on the fundamental techniques and algorithms used to calculate lens distortion, stage error, and reticle error.

A typical microelectronic device or circuit may consist of 20–30 levels or pattern layers. The placement of pattern features on a given level must match the placement of corresponding features on other levels, i.e., overlap, within an accuracy which is some fraction of the minimum feature size or critical dimension (CD). Overlay error is typically, although not exclusively, measured with a metrology tool appropriately called an overlay tool using several techniques. See for example, Semiconductor Pattern Overlay, N. Sullivan, SPIE Critical Reviews Vol. CR52, 160:188. The term overlay metrology tool or overlay tool means any tool capable of determining the relative position of two pattern features or alignment attributes, that are separated within 500 um (microns) of each other. The importance of overlay error and its impact to yield can be found elsewhere. See Measuring Fab Overlay Programs, R. Martin, X. Chen, I. Goldberger, SPIE Conference on Metrology, Inspection, and Process Control for Microlithography XIII, 64:71, March, 1999; New Approach to Correlating Overlay and Yield, M. Preil, J. McCormack, SPIE Conference on Metrology, Inspection, and Process Control for Microlithography XIII, 208:216, March, 1999.

Lithographers have created statistical computer algorithms (for example, Klass II and Monolith) that attempt to quantify and divide overlay error into repeatable or systematic and non-repeatable or random effects. See Matching of Multiple Wafer Steppers for 0.35 micron Lithography using advanced optimization schemes, M. van den Brink, et al., SPIE VOL. 1926, 188:207, 1993; A Computer Aided Engineering Workstation for registration control, E. McFadden, C. Ausschnitt, SPIE Vol. 1087, 255:266, 1989; Semiconductor Pattern Overlay, supra; Machine Models and Registration, T. Zavecz, SPIE Critical Reviews Vol. CR52, 134:159. An overall theoretical review of overlay modeling can be found in Semiconductor Pattern Overlay, supra.

Overlay error is typically divided into the following two major categories. The first category, inter-field or grid overlay error, is concerned with the actual position of the overall device pattern imaged into the photoresist on a silicon wafer using an exposure tool, i.e., stepper or scanner as referenced from the nominal center of the wafer, see FIG. 18.

Obviously, the alignment of the device pattern on the silicon wafer depends on the accuracy of the stepper or scanner wafer handling stage or wafer stage. Overlay modeling algorithms typically divide inter-field or grid error into five sub-categories or components, each named for a particular effect: translation, rotation, magnification or scale (in both x and y directions), non-orthogonality, and residuals. See A Computer Aided Engineering Workstation for registration control, supra.

The second category, intra-field overlay error, is the positional offset of an individual point inside a field referenced to the nominal center of an individual exposure field, as illustrated in FIG. 19. The term "nominal center" means the exact location of the center of a "perfectly" aligned exposure field; this is the same as the requested field center coordinates given to the lithography tool when it is programmed for the job. Intra-field overlay errors are generally related to lens aberrations, scanning irregularities, and reticle alignment. Four sub-categories or components of intra-field overlay error include: translation, rotation, magnification and lens distortion. It is common practice to make certain assumptions concerning the magnitude and interaction of stage error and lens distortion error in modern overlay algorithms that calculate lens distortion. The common rule is: "trust the accuracy of the stage during the creation of the overlay targets by making the simple assumption that only a small amount of stage error is introduced and can be accounted for statistically". See A "golden standard" wafer design for optical stepper characterization, K. Kenp, C. King, W. W, C. Stager, SPIE Vol. 1464, 260:266, 1991; Matching Performance for multiple wafer steppers using an advanced metrology procedure, M. van den Brink, et al., SPIE Vol. 921, 180:197, 1988.

It is important for this discussion to realize that most overlay measurements are made on silicon product wafers after each photolithographic process, prior to final etch. Product wafers cannot be etched until the resist target patterns are properly aligned to the underlying target patterns. See Super Sparse overlay sampling plans: An evaluation of Methods and Algorithms for Optimizing overlay quality control and Metrology tool Throughput, J. Pellegrini, SPIE Vol. 3677, 72:82, 36220. Manufacturing facilities rely heavily on exposure tool alignment and calibration procedures. See Stepper Matching for Optimum line performance, T. Dooly, Y. Yang, SPIE Vol. 3051, 426:432, 1997; Mix-And-Match: A necessary Choice, R. DeJule, Semiconductor International, 66:76, February, 2000; Matching Performance for multiple wafer steppers using an advanced metrology procedure, supra, to help insure that the stepper or scanner tools are aligning properly; inaccurate overlay modeling algorithms can corrupt the exposure tool calibration procedures and degrade the alignment accuracy of the exposure tool system. See Super Sparse overlay sampling plans: An evaluation of Methods and Algorithms for Optimizing overlay quality control and Metrology tool Throughput, supra.

Over the past 30 years the microelectronics industry has experienced dramatic rapid decreases in critical dimension by moving constantly improving photolithographic imaging systems. Today, these photolithographic systems are pushed to performance limits. As the critical dimensions of semiconductor devices approach 50 nm the overlay error requirements will soon approach atomic dimensions. See Life Beyond Mix-and-Match: Controlling Sub-0.18 micron Overlay Errors, T. Zavecz, Semiconductor International, July, 2000. To meet the needs of next generation device specifications new overlay methodologies will need to be developed. In particular, overlay methodologies that can accurately separate out systematic and random effects and break them into assignable causes will greatly improve device process yields. See A New Approach to Correlating Overlay and Yield, supra.

In particular, those new overlay methodologies that can be implemented into advanced process control or automated control loops will be most important. See Comparisons of Six Different Intra-field Control Paradigms in an advanced mix and match environment, J. Pellegrini, SPIE Vol. 3050, 398:406, 1997; Characterizing overlay registration of concentric 5X and 1X stepper Exposure Fields using Inter-field Data, F. Goodwin, J. Pellegrini, SPIE Vol. 3050, 407:417, 1997. Finally, another area where quantifying lens distortion error is of vital concern is in the production of photomasks or reticles during the electron beam manufacturing process. See Handbook of Microlithography and Microfabrication Vol. 1 P. Rai-Choudhury 1997 pg. 417.

Semiconductor manufacturing facilities generally use some version of the following complex overlay procedure to help determine the magnitude of lens distortion independent of other sources of systematic overlay error. The technique has been simplified for illustration. See Analysis of image field placement deviations of a 5× microlithographic reduction lens, D. MacMillen, et al., SPIE Vol. 334, 78:89, 1982. FIGS. 2 and 3 show typical sets of overlay targets 300, including—one large or outer box 302 and one small or inner target box 304. FIG. 1 shows a typical portion of a distortion test reticle 102 used in the prior art. It should be noted that the chrome target patterns on most reticles are 4 or 5 times larger as compared with the patterns they produce at the image plane, this simply means modern steppers are reduction systems. Further, for purposes of discussion, it is assumed that the reticle pattern is geometrically perfect, (in practice, the absolute positions of features on the reticle can be measured and the resulting errors subtracted off). First, a wafer covered with photoresist is loaded onto the wafer stage and globally aligned. Next, the full-field image of the reticle, 102 in FIG. 1 is exposed onto the resist-coated wafer 2102 in FIG. 21. For purposes of illustration, we assume that the distortion test reticle consists of a 5×5 array of outer boxes evenly spaced a distance M*P, across the reticle surface see FIG. 1. It is typically assumed that the center of the optical system is virtually aberration free. See Analysis of image field placement deviations of a 5× microlithographic reduction lens, supra. With this assumption, the reticle, 102 in FIG. 1 is now partially covered using the reticle blades, 1704 in FIG. 17, in such a way that only a single target at the center of the reticle field, box 104, in FIG. 1, is available for exposure. Next, the wafer stage is moved in such a way as to align the center of the reticle pattern directly over the upper left hand corner of the printed 5×5 outer box array, wafer position 2106, FIG. 21. The stepper then exposes the image of the small target box onto the resist-coated wafer. If the stepper stage and optical system were truly perfect then the image of the small target box would fit perfectly inside the image of the larger target box, as illustrated in FIGS. 4, and 21, from the previous exposure.

At this point the stepper and wafer stage are programmed to step and expose the small target box in the 5×5 array where each exposure is separated from the previous one by the stepping distance P. With the assumption of a perfect stage, the final coordinates of the small target boxes are assumed to form a perfect grid, where the spacing of the grid is equal to the programmed stepping distance, P. Finally, if the first full-field exposure truly formed a perfect image, then the entire 5×5 array of smaller target boxes would fit perfectly inside the 5×5 array of larger target boxes as illustrated in FIG. 4A. Since the first full-field exposure pattern is in fact distorted due to an imperfect imaging system the actual position of the larger target box will be displaced relative to the smaller target boxes for example, as shown in FIG. 31. The wafer is then sent through the final few steps of the photographic process to create the final resist patterned overlay targets. The overlay error at each field position, see FIGS. 28, 29, and 30, can be measured with a standard optical overlay tool and displayed in vector notation see FIGS. 28–30. Using the models described below (eq1 and eq2) the overlay data is analyzed and the lens distortion error is calculated.

The following inter-field and intra-field modeling equations are commonly used to fit the overlay data using a least square regression technique. See Analysis of image field placement deviations of a 5× microlithographic reduction lens, supra.

$$dxf(xf,yf) = Tx + s*xf - q*yf + t1*xf^2 + t2*xf*yf - E*(xf^3 + xf*yf^2) \quad (eq\ 1)$$

$$dyf(xf,yf) = Ty + s*yf + q*xf + t2*yf^2 + t1*xf*yf - E*(yf^3 + yf*xf^2) \quad (eq\ 2)$$

where
(xf,yf)=intra-field coordinates
(dxf, dyf)(xf,yf)=intra-field distortion at position (xf, yf)
(Tx, Ty)=(x,y) intra-field translation
s=intra-field overall scale or magnification
q=intra-field rotation
(t1, t2)=intra-field trapezoid error
E=intra-field lens distortion.

A problem with this technique is two-fold, first, it is standard practice to assume that the wafer stage error is very small, randomly distributed, and can be completely accounted for using a statistical model. See Analysis of image field placement deviations of a 5× microlithographic reduction lens, supra; A "golden standard" wafer design for optical stepper characterization, supra; Matching Management of multiple wafer steppers using a stable standard and a matching simulator, supra; Matching Performance for multiple wafer steppers using an advanced metrology procedure, supra. In general, the wafer stage introduces both systematic and random errors, and since the lens distortion is measured only in reference to the lithography tool's wafer stage, machine to machine wafer stage differences show up as inaccurate lens distortion maps. Secondly, the assumption that lens distortion is zero at the center of the lens incorrect.

A technique for stage and 'artifact' self-calibration is described in Self-calibration in two-dimensions: the experiment, M. Takac, J. Ye, M. Raugh, R. Pease, C. Berglund, G. Owen, SPIE Vol. 2725, 130:146, 1996; Error estimation for lattice methods of stage self-calibration, M. Raugh, SPIE. Vol. 3050, 614:625, 1997. It consists of placing a plate (artifact) with a rectangular array of measurable targets on a stage and measuring the absolute positions of the targets using a tool stage and the tool's image acquisition or alignment system. This measurement process is repeated by reinserting the artifact on the stage but shifted by one target spacing in the X-direction, then repeated again with the artifact inserted on the stage shifted by one target spacing in the Y-direction. Finally, the artifact is inserted at 90-degrees relative to its initial orientation and the target positions measured. The resulting tool measurements are a set of (x, y) absolute positions in the tool's nominal coordinate system. Then, the absolute positions of both targets on the artifact and a mixture of the repeatable and non-repeatable parts of the stage x, y grid error are then determined to within a global translation (Txg, Tyg), rotation (qg) and overall scale ((sxg+syg)/2) factor. This technique is not directly applicable to the present situation since it requires that the measurements be performed on the same machine that is being assessed by this technique. Furthermore, this prior art technique requires measurements made on a tool in absolute coordinates; the metrology tool measures the absolute position of the printed targets relative to it's own nominal center; so absolute measurements are required over the entire imaging field (typical size>~100 mm^2).

Therefore there is a need for an effective way to determine the lens distortion of a projection system independent of other sources of systematic overlay error.

SUMMARY

A projection lens distortion error map is created using overlay targets and a special numerical algorithm. A reticle including an array of overlay targets is exposed several times onto a photoresist coated silicon wafer using a photolithographic stepper or scanner. After exposure, the overlay target patterns are measured for placement error. The resulting overlay data is then supplied to a software program that generates a lens distortion map for the photolithographic projection system. The technique does not require the use of a special reference wafer in order to obtain a complete set of lens distortion data.

An aspect of the technique is that it determines all lens distortion error excluding total translational, rotational, orthogonality and x and y scale placement errors. In addition, the results are decoupled from the effects of stage, wafer alignment, and reticle alignment error. Decoupling these errors from lens distortion error allows the user to more accurately model other sources of placement error in the lithographic process. The technique can be adjusted for accuracy by simply adjusting the number of measurements or stepping patterns used to create the overlay targets.

One aspect includes exposing wafer alignment marks or overlay targets so as to make complete alignment attributes. Positional offsets of the alignment attributes are measured and a lens distortion map determined. The positional offsets can be measured using conventional overlay metrology tools or a lithography tool's wafer alignment mark measurement system.

Completed alignment attributes can include X shear field patterns, Y shear field patterns, or a combination of W shear and Y shear field patterns.

Other features and advantages of the present invention should be apparent from the following description of exemplary embodiments, which illustrate, by way of example, aspects of the invention.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction the accompanying drawings in which:

FIG. 2 shows schematics for FIG. 1.
FIG. 3 shows the reticle features corresponding to the schematics of FIG. 2.
FIG. 4 shows example of overlapping regions.
FIG. 4A shows a perfectly centered box in box structure.
FIG. 5 is the schematic for outer box 2 of FIG. 9.
FIG. 6 is outer box 2 as printed on the wafer.
FIG. 7 is the schematic for inner box 1 of FIG. 9.
FIG. 8 is inner box 1 as printed on the wafer.
FIG. 9 is a schematic for 2-dimensional 4XOL reticle.
FIG. 10 is a typical 4XOL reticle overlay set as projected onto the wafer.
FIG. 15 is the process for the second embodiment of this invention.
FIG. 16 illustrates some components of overlay or placement error.
FIG. 28 shows an overlay error vector plot.
FIG. 29 shows the overlay error due to translation.
FIG. 30 shows the overlay error due to rotation.
FIG. 31 shows an overlay measurement.

FIG. 48 is a schematic of yet another example of four completed alignment attributes in a combined X shear and Y shear pattern.

FIG. 49 is a schematic of four completed alignment attributes in a combined X shear, Y shear, and R shear pattern.

FIG. 51 shows a tabular delineation of x and y tilt as a function of intrafield position.

DETAILED DESCRIPTION OF THE INVENTION

Outline of the General Theory

Overlay error is referred to as overlay registration include, registration error and pattern placement error, for our work here, we will simply use the term overlay error or error. For classification purposes, overlay error is typically divided into the following two categories: grid or inter-field and intra-field error. Intra-field error is the overlay error in placement within a projection field, or simply field, of a lithographic projection system. Inter-field error is the overlay error from field to field on the wafer. The physical sources of these errors are generally distinct; inter-field error is due to imaging objective aberrations or possibly scanning dynamics while intra-field errors are due to the wafer alignment system and the wafer stage. The focus of this invention is determination of intra-field error.

Figure 14:
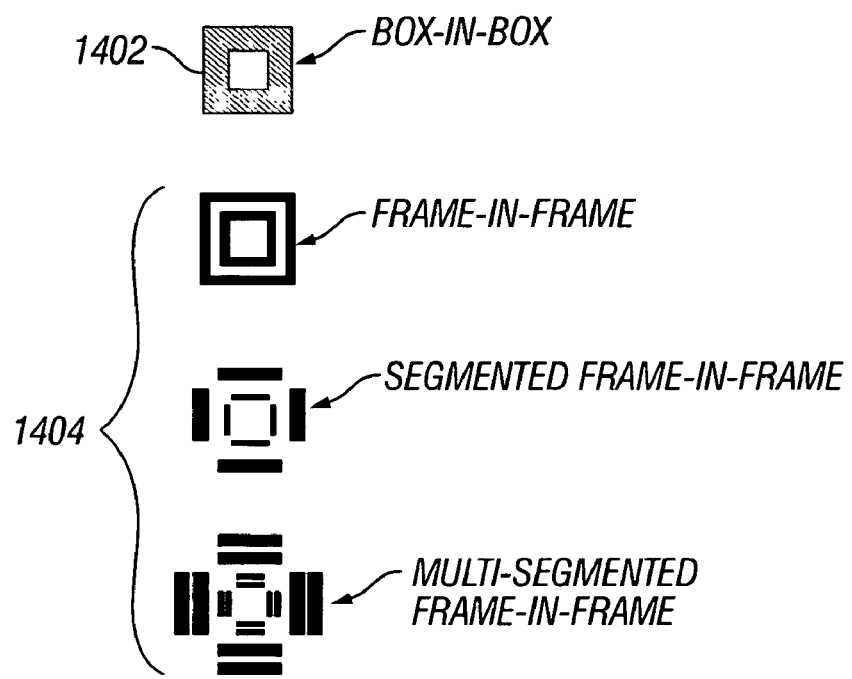
FIG. 14 are typical overlay patterns or alignment attributes.
Figure 17:
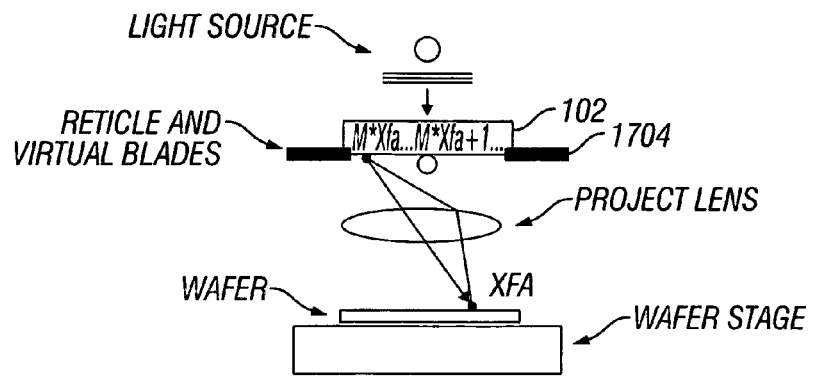
FIG. 17 is a photolithographic stepper or scanner system.
Figure 18:
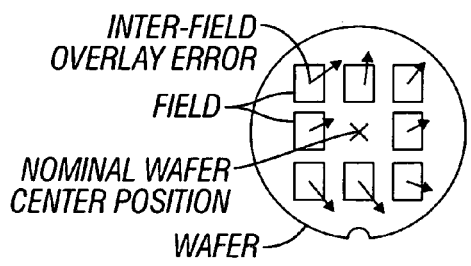
FIG. 18 is an example of inter-field overlay error.
Figure 19:
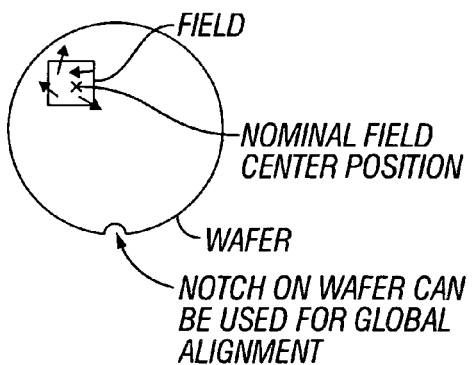
FIG. 19 is an example of intra-field overlay error.

In order to measure overlay error using conventional optical metrology tools, special alignment attributes or overlay target patterns, such as the ones shown in FIG. 14, are printed or imaged onto a properly designed recording media using a photolithographic imaging system such as the one illustrated in FIG. 17. Here recording media is meant to include: positive or negative photoresist, optically activated liquid crystals, CCD or diode imaging arrays, and photographic film. There are many different kinds of alignment attributes including, box-in-box 1402, frame-in-frame 1404 as shown in FIG. 14, as well as gratings, verniers, and electrical test structures. See Automated Electrical Measurements of Registration Errors in Step and Repeat Optical Lithography systems, T. Hasan, et al., IEEE Transactions on Electron Devices, Vol. ED-27, No. 12, 2304:2312, December, 1980; Capacitor Circuit Structure For Determining Overlay Error, K. Tzeng, et al., U.S. Pat. No. 6,143,621, 2000; Overlay Alignment Measurement of Wafers, N. Bareket, U.S. Pat. No. 6,079,256, 2000. The present invention applies to photolithographic steppers, scanners, e-beam systems, EUV and x-ray imaging systems. See Mix-And-Match: A necessary Choice, supra; Reduction imaging at 14 nm using multilayer-coated optics: Printing of features smaller than 0.1 micron, J. Bjorkholm, et al., Journal Vacuum Science and Technology, B 8(6), 1509:1513, November/December 1990; Development of XUV projection lithography at 60–80 nm, B. Newnam, et al., SPIE vol. 1671, 419:436, 1992; Optical Lithography—Thirty years and three orders of magnitude, J. Bruning, SPIE Vol. 3051, 14:27, 1997. FIG. 28 shows a typical vector plot of overlay error measured with a commercial overlay tool using box-in-box structures. In some cases the overlay error can be measured using special in-situ exposure tool metrology. See Matching Management of multiple wafer steppers using a stable standard and a matching simulator, M. Van den Brink, et al., SPIE VOL. 1087, 218:232, 1989. Vector displacement plots like these illustrated in FIG. 28 give a visual description of the direction, magnitude, and location of overlay error, are mathematically separated into components using a variety of regression routines; FIGS. 28–30 are a schematic of this while See Analysis of overlay distortion patterns, J. Armitage, J. Kirk, SPIE Vol. 921, 207:221, 1988 contains numerous examples. Many commercial software packages exist (Monolith, See A Computer Aided Engineering Workstation for registration control, supra., Klass II; See Lens Matching and Distortion testing in a multi-stepper, submicron environment, A. Yost, et al., SPIE Vol. 1087, 233: 244, 1989) that model and statistically determine the relative magnitude of the systematic and random inter-field and intra-field error components for the purpose of process control and exposure tool set-up. Once the inter-field and intra-field overlay data is analyzed the results are used to adjust the calibration constants and absolute position of the reticle stage, wafer handling stage and projection lens system to improve pattern alignment.

Preferred Embodiment

Figure 20A:
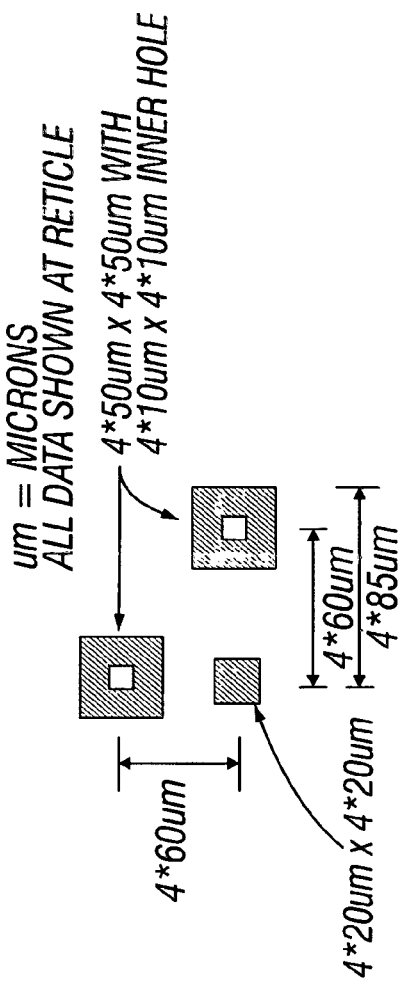
FIG. 20A shows the typical detail of the individual overlay groups of FIG. 20.
Figure 20:
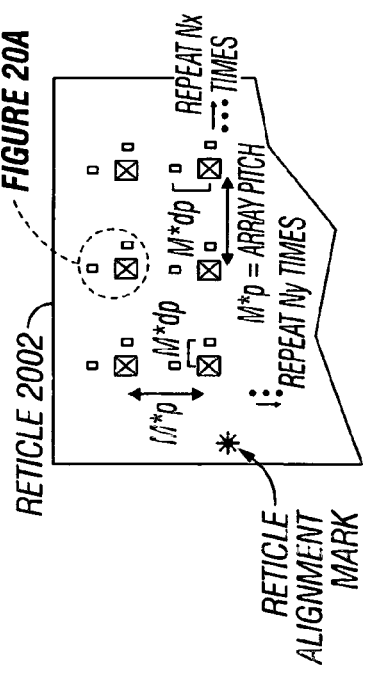
FIG. 20 shows the overlay reticle of this invention.
Figure 34:
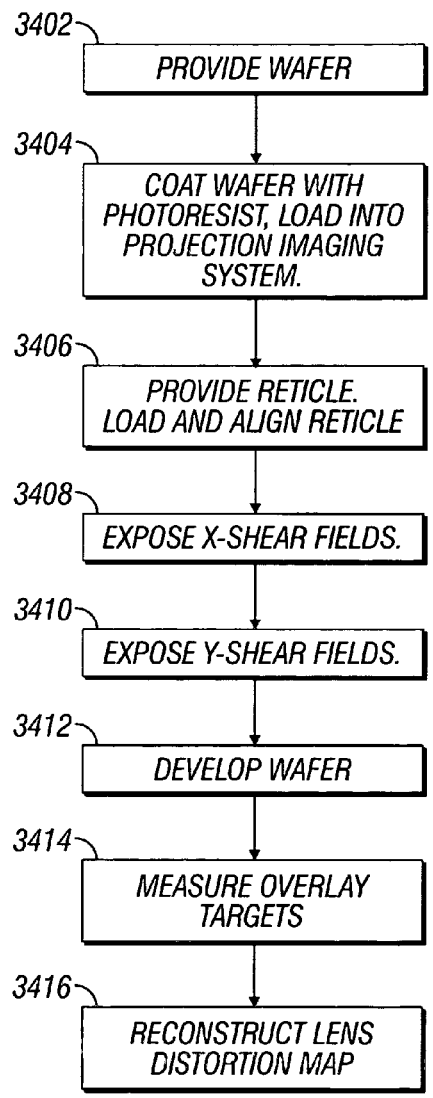
FIG. 34 shows the process flow for the preferred embodiment of this invention.

A simple and accurate methodology that allows for the extraction of lens distortion placement error excluding total translation, rotation, orthogonality and x and y scale error and is mathematically decoupled from stage error is described. FIG. 34 illustrates the methodology in terms of a process flow diagram. First, in block 3402, a wafer is provided; wafer alignment marks are not required, a bare wafer can be used. Next, in block 3404, the wafer is coated with resist and loaded onto the projection imaging system or machine. Then in block 3406, a reticle pattern such as illustrated in FIG. 20, including a two dimensional array of box structures or targets of various sizes, see FIG. 20A, is loaded into the machine's reticle management system and aligned to the reticle table. The reticle pattern can be, for example, an Nx×Ny array of overlay groups as shown in FIG. 20A with a portion of the whole Nx×Ny array being schematically shown in FIG. 20.

Figure 35:
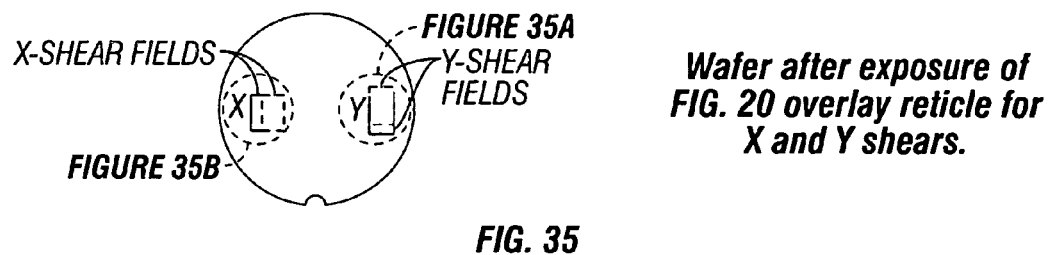
FIG. 35 shows the wafer after exposure of the X and Y shears.
Figure 35A:
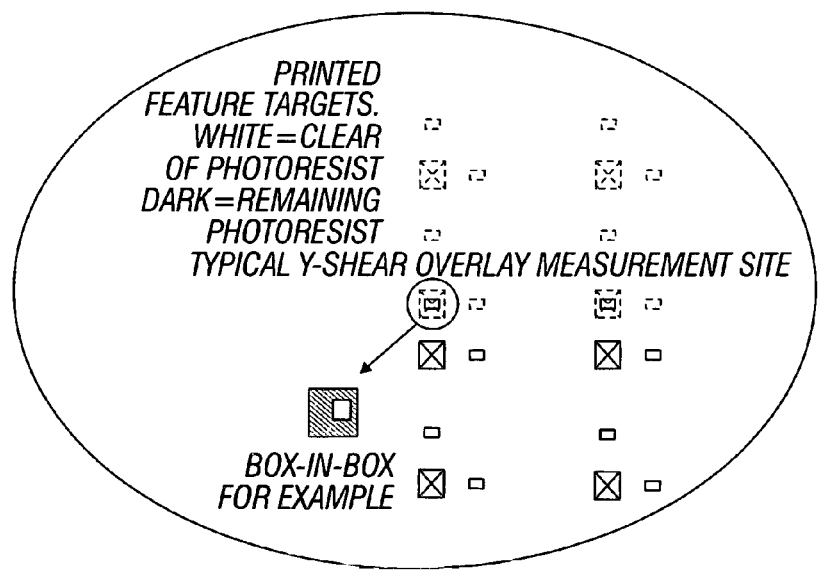
FIG. 35A details the Y shear of FIG. 35.
Figures 35B, 36:
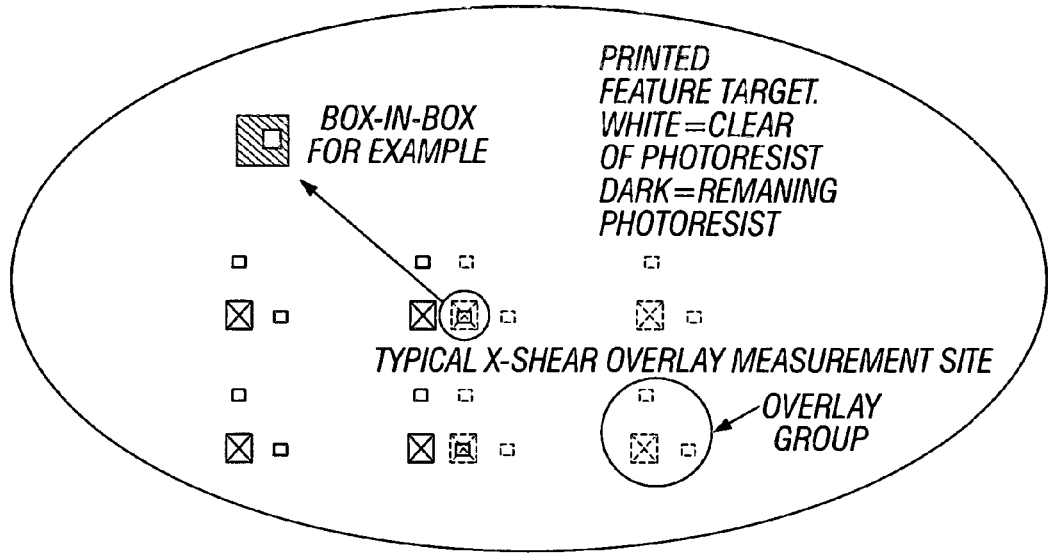
FIG. 35B details the X shear of FIG. 35.
FIG. 36 shows the final results of the method of this invention.

Then in blocks 3408 and 3410 the reticle pattern is exposed at two field positions across the wafer illustrated by the solid outlines in FIGS. 35A and 35B, with the field center at grid positions (xX1, yX1), (xY1, yY1) representing the first exposure for the X-shear and Y-shear respectively. To minimize confusion, these exposure fields are typically separated by a distance>120%*max(Lx, Ly), where the exposure field has rectangular dimension Lx×Ly. Each full-field exposure produces an Mx×My array (Mx<=Nx, My<=Ny) of overlay groups at the wafer surface, FIGS. 35A and 35B illustrate the Mx=My=2 case.

Using the same reticle shown in FIG. 20 the wafer stage is blind stepped to expose the second layer of the X-shear pattern with field center located at nominal grid position (xX1+p+dp, yX1). Referring to FIGS. 20 and 20A, M*p is the feature pitch or period of the overlay group on the reticle while M*dp is the offset of the inner box structures within the overlay group from the outer box structures. M is the reduction magnification ratio (M=4 or 5 typically) of the machine so that p is the pitch of overlay groups on the wafer while dp is the wafer offset of inner and outer boxes within an overlay group.

FIGS. 35A and 35B show the Y and X shears for an Mx×My=2×2 array. The entire X-shear pattern consists of a set of Mx−1×My overlapped box in box structures as illustrated in FIG. 35B. Typical values for p are in the range of about 0.5 mm to about 10 mm while typical values for dp are in the range of about 0.02 mm to 1 mm. A constraint on p is that it be small enough to provide detailed enough coverage of the lens distortion pattern. Stated differently, the lens distortion should be sampled at a fine enough interval such that the distortions at the unmeasured locations in between the overlay groups are reasonably approximated (<30% error) by interpolating the values of lens distortion measured on pitch p. A constraint on offset dp is that it lie within an area where the lens distortion is not varying significantly. Stated differently, the overlay group as shown in FIG. 20A, should lie within an isoplanatic distortion patch of the lens, herein defined as being a region over which the lens distortion varies by <5% of the maximum value of the lens distortion.

Again using the same reticle as shown in FIG. 20, the wafer stage is blind stepped to expose the second layer of the Y-shear pattern with field center located at nominal grid position (xY1, yY1+p+dp). FIG. 35A shows the pattern for an Mx×My =2×2 array. The entire pattern consists of a set of Mx×My−1 overlapped box in box structures as shown in FIG. 35B.

Next, in block 3412, the wafer is developed and sent to the overlay tool where in block 3414 the following sets of overlay targets are measured:

$$\text{X-shears} \quad Mx\text{-}1 \times My \quad \text{array} \quad \text{(eq 3)}$$

$$\text{Y-shears} \quad Mx \times My\text{-}1 \quad \text{array.} \quad \text{(eq 4)}$$

Then in block 3416 we reconstruct the overlay measurements are used to produce the lens distortion map.

The X-shear measurements can be modeled as:

$$\begin{aligned}BBx(a, b; X) &= [xf(a+1) + dxf(a+1, b) + Tx1 - q1 * \\ &\quad yf(b)] - [xf(a) + p + dxf(a, b) + \\ &\quad Tx2 - q2 * yf(b)] \\ &= dxf(a+1, b) - dxf(a, b) + (Tx1 - Tx2) - \\ &\quad (q1 - q2) * yf(b)\end{aligned} \quad \text{(eq 5)}$$

$$\begin{aligned}BBy(a, b; X) &= [yf(b) + dyf(a+1, b) + Ty1 + q1 * \\ &\quad xf(a+1)] - [yf(b) + dyf(a, b) + \\ &\quad Ty2 + q2 * xf(a)] \\ &= dyf(a+1, b) - dyf(a, b) + (Ty1 - Ty2) + \\ &\quad (q1 * xf(a+1) - q2 * xf(a))\end{aligned} \quad \text{(eq 6)}$$

where:

a,b=x,y indices for measurements. They cover the range, a=1:Mx−1, b=1:My. They correspond with specific columns and rows of the projected overlay groups as illustrated in FIG. 20B.

(BBx, BBy) (a,b;X)=(x,y) box in box measurement results for the X-shears.

(xf(a), yf(b))=nominal projected overlay group (x,y) position within the image field. For a rectangular grid of overlay groups, these form a grid with pitch=p.

(dxf(a,b), dyf(a,b))=intra-field distortion at (x,y) intra-field position=(xf(a), yf(b)).

These are the unknown quantities we wish to determine. The indices a, b cover the range:

a=1:Mx, b=1:My.

(Tx1, Ty1, q1)=stage positioning error in (x, y, yaw) for the X shear exposure at nominal grid position (xX1, yX1).

(Tx2, Ty2, q2)=stage positioning error in (x, y, yaw) for the X shear exposure at nominal grid position (xX1+p+dp, yX1).

Yaw is simply the rotation induced by the wafer stage on the projected field.

The Y-shear measurements can be modeled as:

$$\begin{aligned}BBx(a, b; Y) &= [xf(a) + dxf(a, b+1) + Tx3 - q3 * \\ &\quad yf(b+1)] - [xf(a) + dxf(a, b) + \\ &\quad Tx4 - q4 * yf(b)] \\ &= dxf(a, b+1) - dxf(a, b) + (Tx3 - Tx4) - \\ &\quad (q3 * yf(b+1) - q4 * yf(b))\end{aligned} \quad \text{(eq 7)}$$

$$\begin{aligned}BBy(a, b; Y) &= [yf(b+1) + dyf(a, b+1) + Ty3 + q3 * \\ &\quad xf(a)] - [yf(b) + p + dyf(a, b) + Ty4 + \\ &\quad q4 * xf(a)] \\ &= dyf(a, b+1) - dyf(a, b) + (Ty3 - Ty4) + \\ &\quad (q3 - q4) * xf(a)\end{aligned} \quad \text{(eq 8)}$$

where:

a,b=x,y indices for measurements. They cover the range, a=1:Mx, b=1:My−1.

(BBx, BBy) (a,b;Y)=(x,y) box in box measurement results for the Y-shears.

(Tx3, Ty3, q3)=stage positioning error in (x, y, yaw) for the Y shear exposure at nominal grid position (xY1, yY1).

(Tx4, Ty4, q4)=stage positioning error in (x, y, yaw) for the Y shear exposure at nominal grid position (xX1, yX1+p+dp)—and the other symbols are as above.

Figure 26:
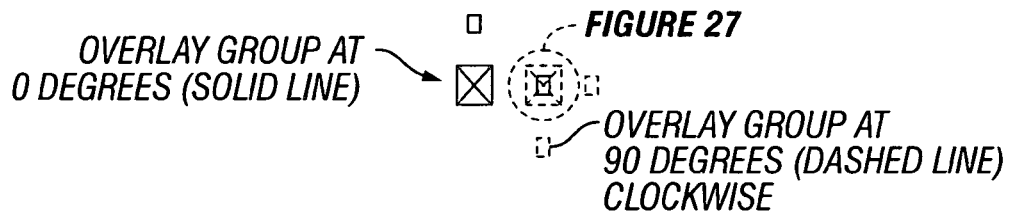
FIG. 26 shows a close-up of overlay groups for the R-shear.
Figure 27:
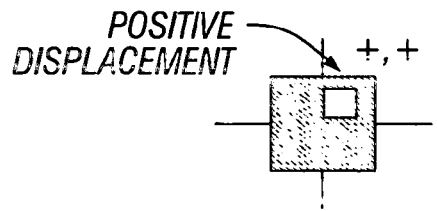
FIG. 27 shows a single box in box target.
Figure 32:
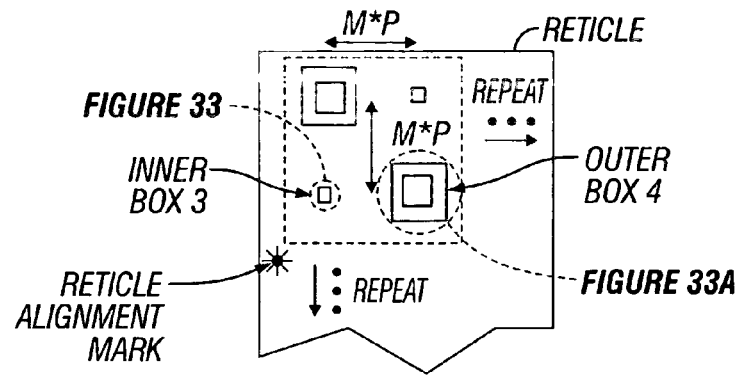
FIG. 32 shows an alternate embodiment overlay reticle.
Figure 33:
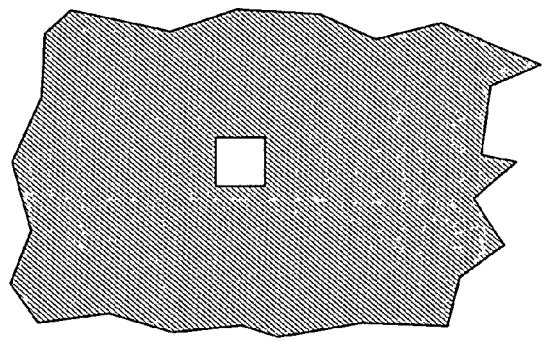
FIG. 33 details inner box 3 of FIG. 32.
Figure 33A:
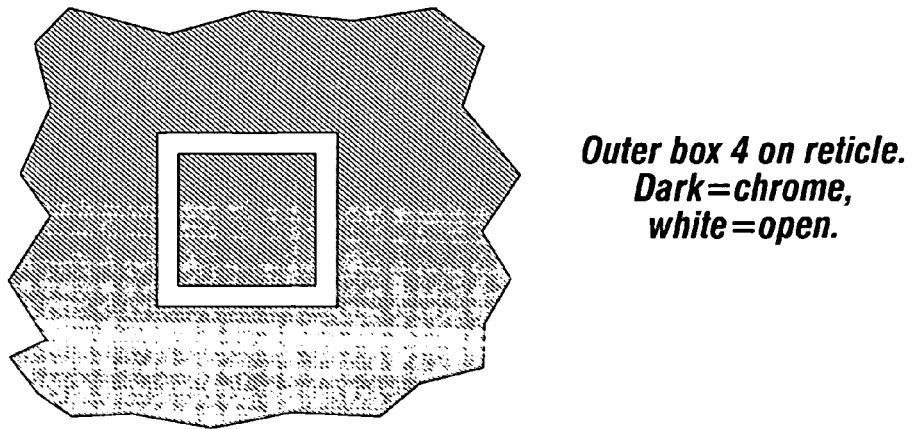
FIG. 33A details outer box 4 of FIG. 32.

In equations 5–8, the inner box occurs in the box in box measurements in such a way that the position of the inner box is shifted to the upper right hand corner (positive quadrant in x,y plane) of the outer box, the resulting box in box measurement is positive for both x and y components (BBx>0, BBy>0), See FIGS. 26 and 27.

Equations 5–8 are typically over-determined in the sense of equation counting, there are more equations than unknowns, but are still singular in the mathematical sense; there is an ambiguity in the solution of these equations. The unknowns in equations 5–8 are the intra-field distortion map (dxf(a,b), dyf(a,b)), and all of the stage positioning and yaw errors (Tx1,Ty1,q1), . . . (Tx4, Ty4, q4). Now it can be mathematically shown that we can solve for the distortion map (dxf(a, b), dyf(a, b)) uniquely to within a translation, rotation, orthogonality, and x and y scale factors. Put differently, if (dxf(a,b), dyf(a,b)) is a solution to equations 5–8, then (dxf(a, b)+Tx−(q−qo)*yf(b)+sx*xf(a), dyf(a,b)+Ty+q*xf(a)+sy*yf(b)) is also a solution of equations 5–8 where:
Tx, Ty=arbitrary translation,
q=arbitrary rotation,
qo=arbitrary orthogonality
sx=arbitrary x-scale or x-magnification error
sy=arbitrary y-scale or y-magnification error.

To uniquely define a solution we can require that the computed solution have zero values for these modes.
Then:

$$\Sigma\ dxf(a, b) = 0 \quad \text{no } x \text{ translation in intra-field distortion} \quad (\text{eq } 9)$$

$$\Sigma\ dyf(a, b) = 0 \quad \text{no } y \text{ translation in intra-field distortion} \quad (\text{eq } 10)$$

$$\Sigma\ xf(a)*dyf(a, b) = 0 \quad (\text{eq } 11)$$

$$\Sigma\ yf(b)*dxf(a, b) = 0 \quad (\text{eq } 12)$$

$$\Sigma\ xf(a)*dxf(a, b) = 0 \quad \text{no } x\text{-scale or } x\text{-magnification error} \quad (\text{eq } 13)$$

$$\Sigma\ yf(b)*dyf(a, b) = 0 \quad \text{no } y\text{-scale or } y\text{-magnification error} \quad (\text{eq } 14)$$

where Σ denotes summation over all intra-field grid points (a=1:Mx, b=1:My). Equations 11 and 12 together are interpreted as meaning there is no rotation or non-orthogonality. Equations 9–14 represent the preferred embodiment for the determination of the intra-field distortion since it can be shown that when it is so determined, the stage errors in translation and yaw are completely decoupled from the resulting intra-field grid distortion. Put differently, the intra-field distortion so determined is completely independent of wafer stage error, wafer alignment error, and reticle alignment error.

Equations 5–8 are typically solved using the singular value decomposition to produce the minimum length solution. See Numerical Recipes, The Art of Scientific Computing, W. Press, et al., Cambridge University Press, 52:64, 1990. It can be shown that the constraints of Equations 9–14 effectively define a unique solution within the null space of equations 5–8, and therefore they can be applied after the minimum length solution (dxfm, dyfm) has been determined.

Then solving for Tx, Ty, q, qo, sx, sy from the equations:

$$\Sigma dxfm(a,b)+Tx-(q-qo)*yf(b)+sx*xf(a)=0 \quad (\text{eq } 14)$$

$$\Sigma dyfm(a,b)+Ty+q*xf(a)+sy*yf(b)=0 \quad (\text{eq } 15)$$

$$\Sigma xf(a)*(dyfm(a,b)+Ty+q*xf(a)+sy*yf(b))=0 \quad (\text{eq } 16)$$

$$\Sigma yf(b)*(dxfm(a,b)+Tx-(q-qo)*yf(b)+sx*xf(a))=0 \quad (\text{eq } 17)$$

$$\Sigma xf(a)*(dxfm(a,b)+Tx-(q-qo)*yf(b)+sx*xf(a))=0 \quad (\text{eq } 18)$$

$$\Sigma yf(b)*(dyfm(a,b)+Ty+q*xf(a)+sy*yf(b))=0 \quad (\text{eq } 19)$$

and the intra-field distortion array satisfying eq 14–19 is:

$$dxf(a,b)=dxfm(a,b)+Tx-(q-qo)*yf(b)+sx*xf(a) \quad (\text{eq } 20)$$

$$dyf(a,b)=dyfm(a,b)+Ty+q*xf(a)+sy*yf(b) \quad (\text{eq } 21)$$

At this point the final results of the intra-field lens distortion can be recorded in tabular form as shown in FIG. 36.

Further Embodiments

In another embodiment, if it is believed or there is evidence that the wafer stage and reticle alignment system are extremely accurate and repeatable for example if the accuracy and repeatability <~overlay metrology tool accuracy and repeatability), then all stage positioning and yaw errors (Tx1,Ty1,q1), . . . (Tx4, Ty4, q4) can be set to zero in equations 5–8. Not solving for the T's and q's allows determining the intra-field distortion uniquely to within an overall translation. That is, a unique solution that includes field rotation, orthogonality, and x and y scale is obtained if the constraints of equation 9 and equation 10 through equations 14 and 15 are imposed and then calculate (dxf, dyf) using the resulting Tx, Ty values and setting q=qo=sx=sy=0 in equations 20 and 21.

Analysis of the solutions of eq. 5–8 shows that the influence of overlay metrology tool measurement repeatability upon the resulting intra-field distortion map is minimal. If, sol is the one sigma, one axis overlay metrology tool statistical repeatability, then in general, the root mean square (RMS) error this induces on the intra-field distortion at point (xf(a), yf(b)) is given by;

$$\sigma x(a,b)=Cx(a,b)*sol \quad (\text{eq } 22)$$

$$\sigma y(a,b)=Cy(a,b)*sol \quad (\text{eq } 23)$$

where;
σx(a,b)/σy(a,b)=RMS error in dxf(a,b)/dyf(a,b)
Cx(a,b)/Cy(a,b)=x/y error multipliers at intra-field point (xf(a), yf(b)).

The error multipliers (Cx, Cy) can be calculated for each intra-field point. In general, error multipliers near the edge or corner of the Mx×My intra-field point array are larger than error multipliers near the center of the array. These error multipliers typically increase as ln(Mx*My). For the specific case of a square array (Mx=My), the error multiplier at the worst point in the array is given approximately by;

$$Cworst=0.17+0.167*ln(Mx*My) \quad (\text{eq } 24)$$

where ln is the Napierian or base e logarithm.

So for an Mx×My=11×11 array, eq 24 would predict a worst error multiplier, Cworst=0.97. The average error multiplier is typically ~30% smaller than the worst or Cavg~0.68. From this discussion it can be seen that by combining measurements together we have reduced the effect of measurement noise leading to a practical, robust, noise resistant procedure for determining intra-field distortion. Furthermore, other embodiments that include more shears, that is displacements of the arrays with respect from each other, than the explicitly enumerated case of an X and Y shear, will lead to even further decreases in the intra-field error multipliers. It is also clear from this discussion, that arrangements having in addition to the X, Y shear, shears that cover the edges and corners and that are measured only at the edges and 2 or more overlay groups deep around the edge of interest, or measured only at the corners and 3 or more overlay groups deep around the corner of interest will further reduce the error multipliers at the highest or worst places.

Second Main Embodiment

Figure 22:
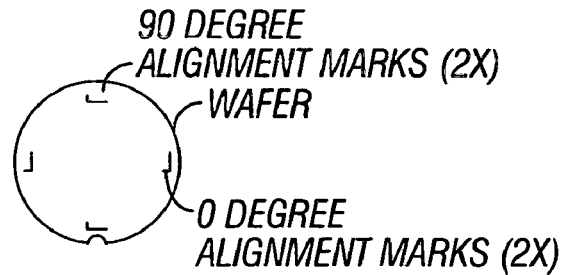
FIG. 22 shows a wafer with alignment marks at 0 and 90 degrees.
Figure 23:
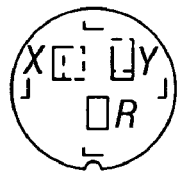
FIG. 23 shows a wafer after exposure of the 0 degree orientation patterns.

Yet another embodiment allows for the extraction of lens distortion placement error excluding total translation, rotation, and overall scale or magnification overlay error and is mathematically decoupled from stage error. FIG. 15 illustrates this embodiment in terms of a process flow diagram. First in block 1502, a wafer is provided. Typically it already has alignment marks suitable for use at normal orientation (0 degrees) and when rotated by 90-degrees as shown in FIG. 22. In cases where the projection imaging tool, or machine, is capable of realigning an unpatterned wafer after a 90-degree rotation to <2 microns, the alignment marks are not required. Next in block 1504, the wafer is coated with photoresist, loaded onto the machine, and possibly aligned. A reticle pattern for example the reticle shown in FIG. 20, consisting of a two dimensional array of box structures or targets of various sizes as shown in FIG. 20A is loaded into the machine's reticle management system and aligned to the reticle table in block 1506. This reticle pattern includes an Nx×Ny array of overlay groups shown in one embodiment in FIG. 20 with a portion of the whole Nx×Ny array being shown in FIG. 9. The reticle pattern is exposed in blocks 1508, 1510, and 1512 at three field positions across the wafer, shown by (solid outlines in FIG. 23, with the field centers at nominal grid positions (xX1, yX1), (xY1, yY1), (xR1, yR1), representing the first exposure for the X-shear, Y-shear and R-shear respectively. To minimize confusion, these exposure fields are typically separated by a distance>120%*max(Lx, Ly), where the exposure field has rectangular dimension Lx×Ly. Each full-field exposure produces an Mx×My array (Mx<=Nx, My<=Ny) of overlay groups at the wafer surface shown by the solid line overlay groups of FIGS. 11, 12, 25.

Figure 11:
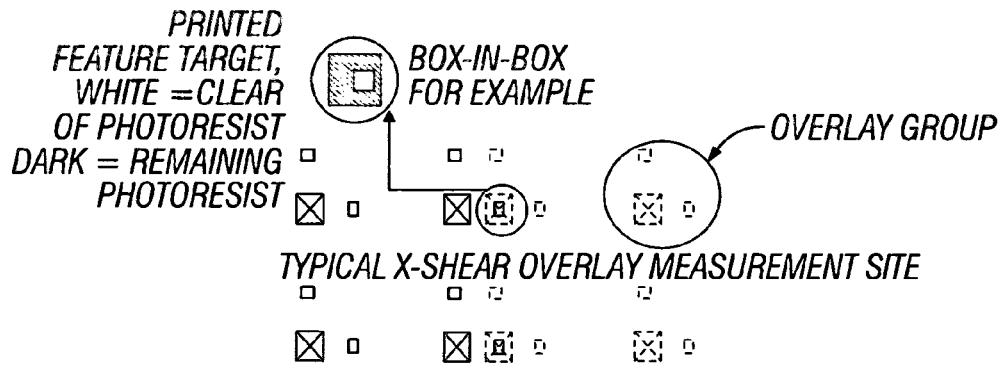
FIG. 11 is a schematic of the X-shear overlay on the wafer.
Figure 24:
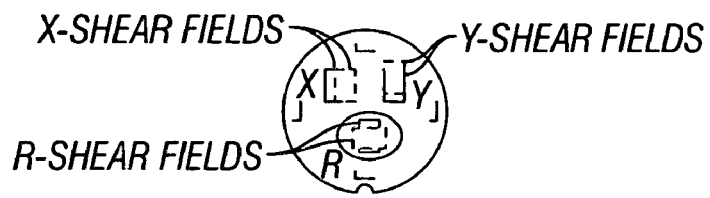
FIG. 24 shows a wafer after exposure of the 0 and 90 degree orientation patterns.

Using the same reticle the wafer stage is blind stepped to expose the second layer of the X-shear pattern with field center located at nominal grid position (xX1+p+dp, yX1). Referring to FIGS. 5, 6, 7, 8, and 9, p is the feature pitch or period of the overlay set or group as shown in FIG. 10, as projected onto the wafer (p=reticle pitch/M=tool demagnification) and dp is the offset of the inner box structures. A portion of the resulting overlapped X-shear pattern is schematically shown in FIG. 11. The entire X-shear pattern consists of a set of Mx−1×My overlapped box in box structures illustrated in FIGS. 24–25. Typical values for p are in the range of about 0.5 mm to about 10 mm while typical values for dp are in the range of about 0.02 mm to about 1 mm. A constraint on p is that it be small enough to provide detailed enough coverage of the lens distortion pattern, while constraint on offset dp is that it lie within an isoplanatic distortion patch of the lens.

Figure 12:
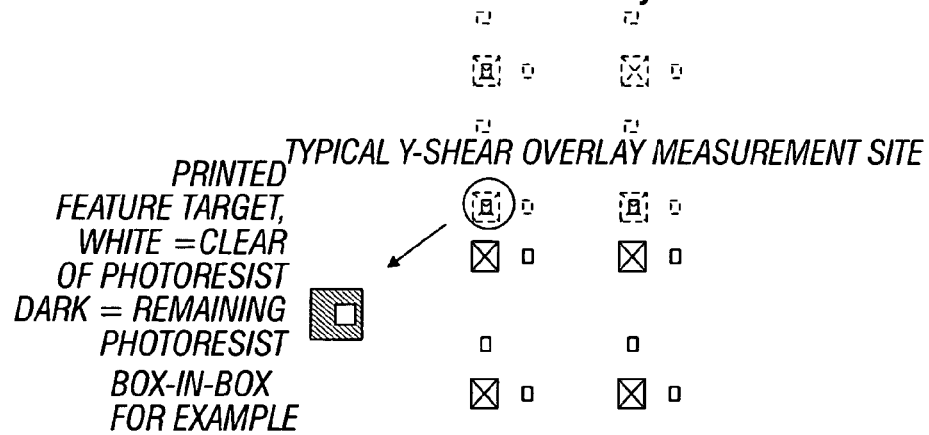
FIG. 12 is a schematic of the Y-shear overlay on the wafer.

Again using the same reticle the wafer stage is blind stepped to expose the second layer of the Y-shear pattern with field center located at nominal grid position (xY1, yY1+p+dp). A portion of the overlapped Y-shear pattern is schematically shown in FIG. 12. The entire pattern consists of a set of Mx×My−1 overlapped box in box structures.

Figure 13:
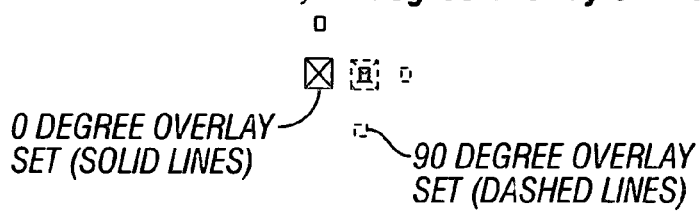
FIG. 13 is a 2-Dimensional reticle schematic, 90 degree overlay of R-shear.
Figure 25:
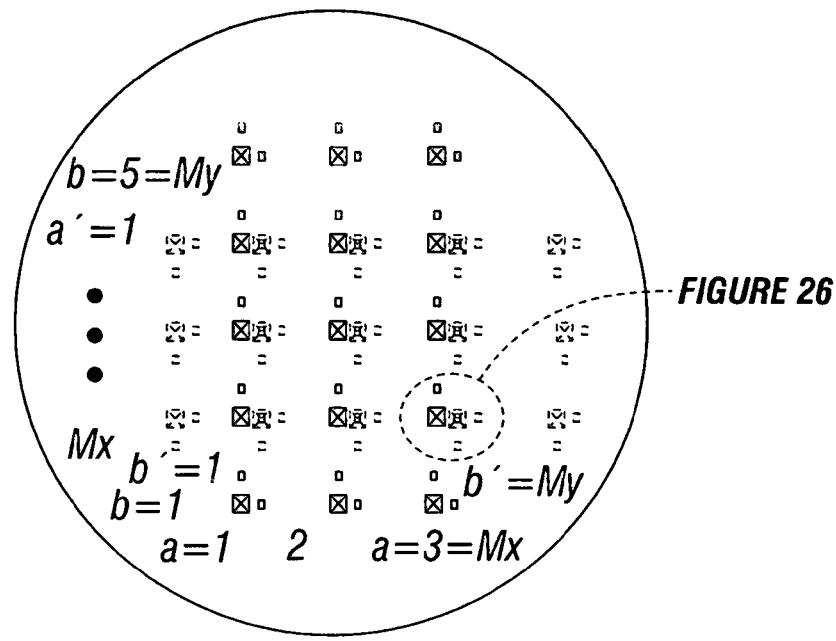
FIG. 25 shows a detail of the R-shear.

Next in block 1514, the wafer is rotated 90-degrees, counterclockwise for our example, possibly aligned off of the 90-degree wafer alignment marks and the reticle exposed in block 1516 at nominal grid position (−yR1, xR1+dp). The resulting overlapped R-shear pattern is schematically shown in FIG. 13 and FIG. 25 and consists of a set of min(Mx, My)×min(Mx, My) overlapped box in box structures, where min is the minimum value of the pair.

Next in block 1518, the wafer is developed and sent to the overlay tool where in block 1520 we measure the following sets of overlay targets:

$$\text{X-shears} \quad Mx\text{-}1 \times My \quad \text{(eq 25)}$$

$$\text{Y-shears} \quad Mx \times My\text{-}1 \quad \text{(eq 26)}$$

$$\text{R-shears} \quad \min(Mx, My) \times \min(Mx, My) \quad \text{(eq 26.1)}$$

Then, in block 1522 the overlay measurements are used to produce the lens distortion map.

The X-shear measurements can be modeled as:

$$\begin{aligned} BBx(a, b; X) &= [xf(a+1) + dxf(a+1, b) + Tx1 - q1 * \\ &\quad yf(b)] - [xf(a) + p + dxf(a, b) + \\ &\quad Tx2 - q2 * yf(b)] \\ &= dxf(a+1, b) - dxf(a, b) + (Tx1 - Tx2) - \\ &\quad (q1 - q2) * yf(b) \end{aligned} \quad \text{(eq 27)}$$

$$\begin{aligned} BBy(a, b; X) &= [yf(b) + dyf(a+1, b) + Ty1 + q1 * \\ &\quad xf(a+1)] - [yf(b) + dyf(a, b) + \\ &\quad Ty2 + q2 * xf(a)] \\ &= dyf(a+1, b) - dyf(a, b) + (Ty1 - Ty2) + \\ &\quad (q1 * xf(a+1) - q2 * xf(a)) \end{aligned} \quad \text{(eq 28)}$$

where:
a,b=x,y indices for measurements. They cover the range, a=1:Mx−1, b=1 My.
(BBx, BBy) (a,b;X)=(x,y) box in box measurement results for the X-shears.
(xf(a), yf(b))=nominal projected overlay group (x,y) position within the image field.
Forms a rectangular grid.
(dxf(a,b), dyf(a,b))=lens distortion at (x,y) field position= (xf(a), yf(b)).
(Tx1, Ty1, q1)=stage positioning error in (x,y,yaw) for the X shear exposure at nominal grid position (xX1, yX1).
(Tx2, Ty2, q2)=stage positioning error in (x,y,yaw) for the X shear exposure at nominal grid position (xX1+p+dp, yX1).

The Y-shear measurements can be modeled as:

$$\begin{aligned} BBx(a, b; Y) &= [xf(a) + dxf(a, b+1) + Tx3 - q3 * \\ &\quad yf(b+1)] - [xf(a) + dxf(a, b) + \\ &\quad Tx4 - q4 * yf(b)] \\ &= dxf(a, b+1) - dxf(a, b) + (Tx3 - Tx4) - \\ &\quad (q3 * yf(b+1) - q4 * yf(b)) \end{aligned} \quad \text{(eq 29)}$$

$$\begin{aligned} BBy(a, b; Y) &= [yf(b+1) + dyf(a, b+1) + Ty3 + q3 * \\ &\quad xf(a)] - [yf(b) + p + dyf(a, b) + Ty4 + \\ &\quad q4 * xf(a)] \\ &= dyf(a, b+1) - dyf(a, b) + (Ty3 - Ty4) + \\ &\quad (q3 - q4) * xf(a) \end{aligned} \quad \text{(eq 30)}$$

where:
a,b=x,y indices for measurements. They cover the range, a=1:Mx, b=1:My−1.
(BBx, BBy) (a,b;Y)=(x,y) box in box measurement results for the Y-shears.
(Tx3, Ty3, q3)=stage positioning error in (x,y,yaw) for the Y shear exposure at nominal grid position (xY1, yY1).
(Tx4, Ty4, q4)=stage positioning error in (x,y,yaw) for the Y shear exposure at nominal grid position (xY1, yY1+p+dp)—and the other symbols are as above.
The R-shear measurements can be modeled as:

$$BBx(a, b; R) = [xR1 + xf(a) + dxf(a, b) + Tx5 - q5*yf(b)] - [xR1 + xf(a) + dyf(a'(b), b'(a)) + Tx6 - q6*yf(b)] \quad \text{(eq 31)}$$
$$= dxf(a, b) - dyf(a'(b), b'(a)) + (Tx5 - Tx6) - (q5 - q6)*yf(b)$$

$$BBy(a, b; R) = [yR1 + yf(b) + dyf(a, b) + Ty5 + q5*xf(a)] - [yR1 + yf(b) + dxf(a'(b), b'(a)) + Ty6 + q6*yf(b)] \quad \text{(eq 32)}$$
$$= dyf(a, b) + dxf(a'(b), b'(a)) + (Ty5 - Ty6) + (q5 - q6)*xf(a)$$

where:
a,b=x,y indices for measurements. They cover the range, a=1:Mx, b=1+(My−Mx)/2:(My+Mx)/2
a'(b)=(My+Mx)/2+1−b (where a' represents the rotated overlay group)
b'(a)=(My−Mx)/2+a
(BBx, BBy) (a,b;R)=(x,y) box in box measurement results for the R-shears.
(Tx5, Ty5, q5)=stage positioning error in (x,y,yaw) for the R shear exposure at nominal grid position (xR1, yR1).
(Tx6, Ty6, q6)=stage positioning error in (x,y,yaw) for the R shear exposure at nominal grid position (−yR1, xR1+dp)—and the other symbols are as above.
The ranges of a,b,a',b' are determined by the need to overlap the rectangular Mx×My array of overlay groups when they are placed at right angles to each other as illustrated in FIG. 25. When Mx<=My the index ranges will be as above.
When Mx>My, we have;
a=1+(Mx−My)/2:(Mx+My)/2
b=1:My
a'(b)=(Mx+My)/2+1−b
b'(a)=(Mx−My)/2+a.

In equations 27–32, the inner box occurs in the box in box measurements in such a way that the position of the inner box is shifted to the upper right hand corner (positive quadrant in x,y plane) of the outer box, the resulting box in box measurement is positive for both x and y components (BBx>0, BBy>0) see FIG. 27.

Equations 27–32 are typically over-determined in the sense of equation counting, there are more equations than unknowns, but are still singular in the mathematical sense; there is an ambiguity in the solution of these equations. The unknowns in equations 27–32 are the intra-field distortion map (dxf(a,b), dyf(a,b)), and all of the stage positioning and yaw errors (Tx1,Ty1,q1), . . . (Tx6,Ty6,q6). Now it can be mathematically shown that we can solve for the distortion map (dxf(a,b), dyf(a,b)) uniquely to within a translation, rotation, and an overall scale or symmetric magnification. Put differently, if (dxf(a,b), dyf(a,b)) is a solution to equations 6–11, then (dxf(a,b)+Tx−q*yf(b)+s*xf(a), dyf(a,b)+Ty+q*xf(a)+s*yf(b)) is also a solution of equations 27–32 where:
Tx, Ty=arbitrary translation,
q=arbitrary rotation,
s=arbitrary overall scale or magnification error.

To uniquely define a solution we can require that the computed solution have zero values for these modes.
Then:

$$\Sigma\, dxf(a, b) = 0 \quad \text{no } x \text{ translation in intra-field distortion} \quad \text{(eq 33)}$$

$$\Sigma\, dyf(a, b) = 0 \quad \text{no } y \text{ translation in intra-field distortion} \quad \text{(eq 34)}$$

$$\Sigma\, xf(a)*dyf(a, b) - yf(b)*dxf(a, b) = 0 \quad \text{no rotation in intra-field distortion} \quad \text{(eq 35)}$$

$$\Sigma\, xf(a)*dxf(a, b) + yf(b)*dyf(a, b) = 0 \quad \text{no overall scale or symmetric magnification in intra-field distortion} \quad \text{(eq 36)}$$

$\Sigma$ denotes summation over all intra-field grid points (a=1:Mx, b=1:My). Equations 33–36 represent the preferred technique for the determination of the intra-field distortion since it can be shown that when it is so determined, the stage errors in translation and yaw are completely decoupled from the resulting intra-field grid distortion. Put differently, the intra-field distortion is completely determined independent of wafer stage error, wafer alignment error, and reticle alignment error.

Equations 27–32 are typically solved using the singular value decomposition to produce the minimum length solution. See Numerical Recipes, The Art of Scientific Computing, supra. It can be shown that the constraints of equations 33–36 effectively define a unique solution within the null space of equations 27–32, and therefore they can be applied after the minimum length solution (dxfm, dyfm) has been determined.

Solve for Tx, Ty, q, s, from the equations:

$$\Sigma dxfm(a,b)+Tx-q*yf(b)+s*xf(a)=0 \quad \text{(eq 37)}$$

$$\Sigma dyfm(a,b)+Ty+q*xf(b)+s*yf(b)=0 \quad \text{(eq 38)}$$

$$\Sigma xf(a)*(dyfm(a,b)+Ty+q*xf(b)+s*yf(b))-yf(b)*(dxfm(a,b)+Tx-q*yf(b)+s*xf(a))=0 \quad \text{(eq 39)}$$

$$\Sigma xf(b)*(dxfm(a,b)+Tx-q*yf(b)+s*xf(a))+yf(a)*(dyfm(a,b)+Ty+q*xf(b)+s*yf(b))=0 \quad \text{(eq 40)}$$

and the intra-field distortion array satisfying eq 37–40 is:

$$dxf(a,b)=dxfm(a,b)+Tx-q*yf(b)+s*xf(a) \quad \text{(eq 41)}$$

$$dyf(a,b)=dyfm(a,b)+Ty+q*xf(a)+s*yf(b) \quad \text{(eq 42)}.$$

With regard to error multipliers, the effect of including the R-shears in these calculations is to further reduce the error multipliers from the X, Y shear case since including more measurements increases the averaging of overlay metrology tool noise and thereby decreases it's influence.

At this point the intra-field distortion (dxf, dyf) has been determined to within a translation, rotation, and an overall scale or symmetric magnification factor and can present and further utilize these results when they are presented in the form of either a text, as shown in FIG. 36, or electronic table.

Variation of the Second Embodiment

In another embodiment, if its believed, or there is evidence, that the wafer stage and reticle alignment system are extremely accurate and repeatable, for example if the accuracy and repeatability <~ overlay metrology tool accuracy/repeatability, then all stage positioning and yaw errors (Tx1,Ty1,q1), . . . (Tx6,Ty6,q6) can be set to zero in equations 27–32. Not solving for the T's and q's allows determining the intra-field distortion uniquely to within an overall translation. That is, a unique solution is obtained that includes field rotation and overall scale if the constraints of equation 33 and equation 34 through equations 37 and 38 are imposed and then calculate (dxf, dyf) using the resulting Tx, Ty values and setting q=s=0 in equations 41 and 42.

Reticle Plate Fabrication

The reticle plate for the preferred embodiment is shown in FIG. 20. The preferred embodiment makes no strict requirements on the size of the reticle plate, the shape of the overlay target patterns or the types of materials used to fabricate the mask plate for example, see FIGS. 20, 32, 33, and 33A. Hundreds of different overlay target patterns are available. See Direct-referencing automatic two-points reticle-to-wafer alignment using a projection column servo system, M. Van den Brink, H. Londers, S. Wittekoek, SPIE Vol. 633, Optical Microlithography V, 60:71, 1986. The preferred embodiment will work with any stepper or scanner system using any type of optical overlay targets or alignment attributes.

Heretofore, we have considered the reticle creating the overlay patterns as perfect. In practice, errors in the reticle manufacture can be taken into account by first measuring the position of all the individual structures in all of the overlay groups using an absolute metrology tool such as the Nikon 5I. See Measuring system XY-51, supra, or Leica LMS IPRO; See Leica LMS IPRO brochure, supra, series tools. Next, in formulating equations 5–8, this reticle error, divided by the lithographic projection tool demagnification, is explicitly written out on the right hand side and then subtracted from the resulting overlay measurements on the left hand side of the equations, thereby canceling out on the right hand side. The result is equations 5–8 as they are written above but with a correction applied to the overlay measurements appearing on the left hand side. The discussion of the solution of these equations then proceeds word for word as before.

Further Discussion and Embodiments

The previous embodiments allow us to extract the intra-field distortion with high accuracy and arbitrary spatial resolution. One key assumption has been that the intra-field distortion (dxf, dyf) is constant from exposure to exposure. This is certainly true over short (<1-day) time intervals under normal operating conditions for steppers or step and repeat (stepper) projection systems. See Optical Lithography—Thirty years and three orders of magnitude, supra] where the intra-field distortion is entirely due to lens aberrations or reticle misalignment. It is also true of step and scan (scanner) systems for exposures that are static; that is the scanning mechanism is not employed during the exposure so that only the strip or annular field; See Optical Lithography—Thirty years and three orders of magnitude, supra of the projection lens determines the field size. In these cases, it is possible to determine the distortion of the static lens field. More generally, the technique of this invention can be applied without loss of accuracy due to non-repeatability in time of the intra-field distortion to any projection lithographic system operated in a mode where the source of the intra-field distortion is constant over short time periods.

In scanners, there is always a distortion contribution from non-repeatable synchronization of the wafer and reticle stages during the scanning action; this is evident from single machine overlay results. See 0.7 NA DUV step and Scan system for 150 nm Imaging with Improved Overlay, J. V. Schoot, SPIE vol. 3679, 448:463, 1999. The technique can still be applied in these situations if this non-repeatability is small enough then there is little to no increase in the error of determination of (dxf, dyf). Larger non-repeatabilities in the intra-field error may require applying the technique multiple times to the same machine to determine in each instance the intra-field distortion. These separate instances of intra-field distortion are then averaged to get an estimate of the repeatable part of the intra-field-distortion. Deviations in the data from this average value allow estimating the standard deviation of the intra-field distortion from the repeatable component. Again, this technique can be used in the presence of other non-repeatabilities in the intra-field distortion such as those caused by electron optics in e-beam lithography.

Figure 34A:
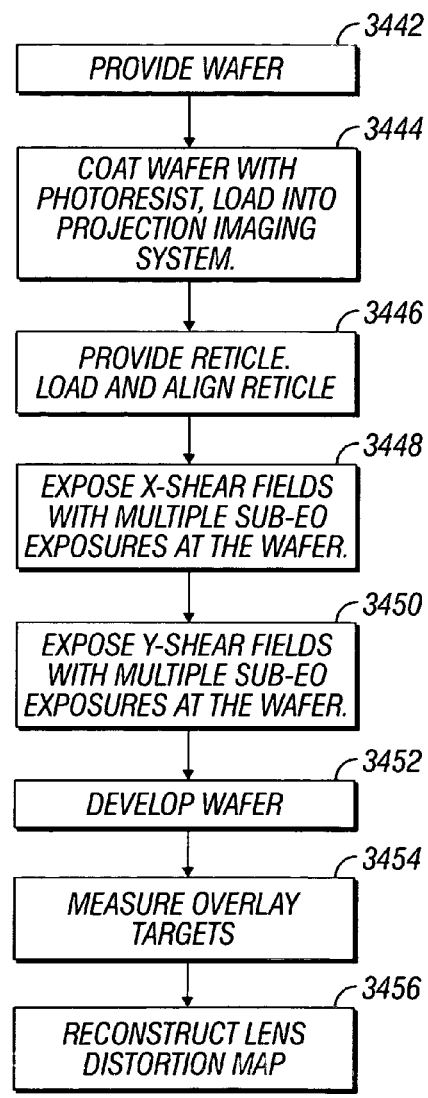
FIG. 34A shows a process flow for the alternate embodiment utilizing sub-Eo exposure doses on the wafer.

A variation of the first two embodiments allows the user to extract the repeatable part of the intra-field distortion with a minimum number of exposed fields and overlay metrology is described. Below, Eo is the E-zero or minimum exposure dose required for a large, i.e. 200 micron at wafer, open area pattern on the reticle to become fully developed, or cleared in the case of positive resist. FIG. 34A illustrates a process flow diagram where in blocks 3442, 3444 and 3446, the overlay target reticle and resist coated wafer are loaded into the projection imaging tool, or machine, as described above. Next in blocks 3448 and 3450, instead exposing each field with a single scanning or exposing action, the machine is programmed to expose each field at a multiplicity of lower doses. So if a*Eo (a>1) is the required dose at the wafer to completely expose a single field with a single exposing action, we expose the field N times at a dose of a*Eo/N, where N is some predetermined number, typically 20. Within these N exposures the wafer stage is not moved to another field position, a single field is exposed N times. In the preferred embodiment, this process is repeated 3 more times for the other fields. The result of this procedure is to average out the scanning non-repeatability by an amount proportional to N (parameterized as b*M). The exact configuration of the resist (novolac, chemically amplified, resist manufacturer, processing conditions) determines whether b=1 or is <1.

If the machine cannot do the desired sub-Eo exposure, then we can use the lowest exposure dose available and expose enough fields with this dose so we get the desired averaging effect.

Then in blocks 3452, 3454, and 3456 the wafer is developed and the overlay targets and are measured and a lens distortion map constructed as described above in connection with FIG. 34.

Figure 20C:
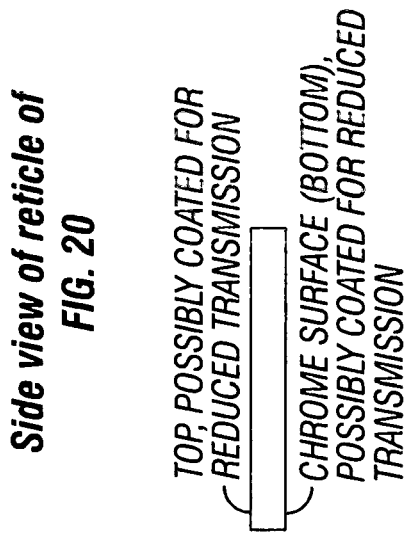
FIG. 20C shows a side view of reticle of FIG. 20.
Figure 20B:
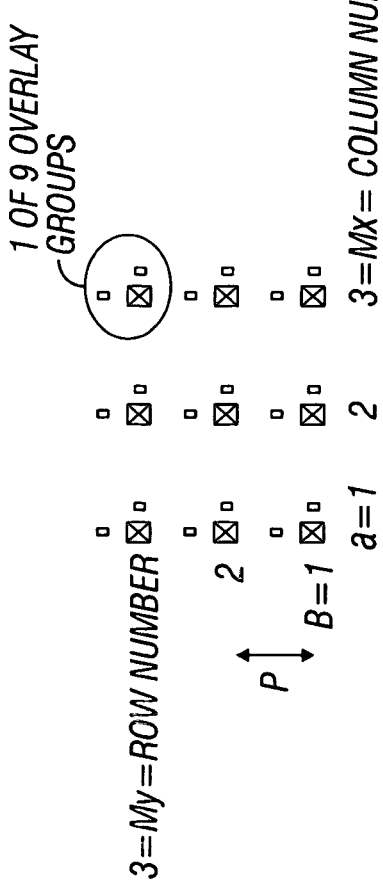
FIG. 20B shows Intra-field indices projected onto the wafer.

In another variation of the first two embodiments, multiple exposing actions are performed to average out the effect of non-repeatability but now the overlay reticle, for example the reticle of FIG. 20, has a partially reflecting dielectric coating either on it's non-chrome or possibly chrome coated (machine optical object plane) surface see FIG. 20C. For example, a 95% reflecting dielectric coating applied to the overlay reticle means that if there are 20 exposure sequences, at a dose of Eo each, the net effect is to expose the wafer with a dose of 2*Eo and to have effectively averaged over as many as 20 exposures. The advantage of this technique is that it is not limited by the machine's ability to do sub-Eo exposures. A further advantage of this technique is that since the exposure doses can be made at the same dose as used in production runs, the dynamics of the scanner movement during the measurement sequence will be the same and therefore the intra-field error measured under identical operating conditions. Thus, if the production dose is a*Eo, the overlay reticle has a coating that reflects a fraction R of light incident on it, then the number of exposures (N) required to get a dose of b*Eo on the measurement wafer is:

$$N=1+\text{floor}(b/(a*(1-R)))  \quad (\text{eq 43})$$

and floor(x)=integer part of the real number x.

As a typical example, a production run at 4*Eo (a=4), using an overlay reticle that is 98% reflecting (R=0.98) and requiring a dose on the measurement wafers of 2*Eo (b=2) means the number of required exposures is (eq 43) N=26 resulting in effectively averaging over as many as 26 realizations of the intra-field distortion. Furthermore, even though the exposure dose was set at the production dose (4*Eo), the dose at the wafer was sub-Eo (less than Eo) because it is equal to (1−R)*4*Eo=0.08*Eo or 8% of Eo. Although this embodiment was described with respect to a partially reflecting reticle, the considerations are similar if the overlay reticle is absorbing or attenuated. An attenuated phase shift mask is well suited for this purpose. See The Attenuated Phase Shift Mask, B. Lin. Instead of reflecting; all that is required is a reticle with a decreased optical transmission from normal. To be useful, the reticle typically needs an optical transmission (1−R for a reflective mechanism) of <50% of normal or nominal.

The techniques described above have been mainly described with respect to alignment attributes that are in the form of a box in box or frame in frame pattern as shown in FIG. 14. Other alignment attributes such as gratings. See U.S. Pat. No. 6,079,256—Overlay Alignment Measurement of Wafer, supra, and FIG. 1b, wafer alignment marks. See Matching Management of multiple wafer steppers using a stable standard and a matching simulator, supra, van der Pauw resistors. See Automated Electrical Measurements of Registration Errors in Step and Repeat Optical Lithography systems, supra, vernier pairs; See Method of Measuring Bias and Edge overlay error for sub 0.5 micron Ground Rules, C. Ausschnitt, et al., U.S. Pat. No. 5,757,507 (1998), capacitor structures. See Capacitor Circuit Structor For Determining Overlay Error, supra could be used instead. In general, any alignment attribute that can be used by an overlay metrology tool for measuring offsets can be utilized by the techniques described.

The overlay metrology tool utilized in the techniques described is typically a conventional optical overlay tool such as those manufactured by KLA-Tencor. See KLA 5105 overlay brochure, supra; 5200 overlay brochure, supra or Bio-Rad Semiconductor Systems; See Quaestor Q7 Brochure, supra. Other optical overlay tools can also be used by, for example, those described in Process for measuring overlay misregistration during semiconductor wafer fabrication, I. Mazor, et al., U.S. Pat. No. 5,438,413 (1995) or Overlay Alignment Measurement of Wafers, supra. In addition, some steppers or scanners. See Matching Management of multiple wafer steppers using a stable standard and a matching simulator, supra can utilize their wafer alignment systems and wafer stages to function as overlay tools. However, in this role the total size of the alignment attribute is usually limited, (consisting of 2 wafer alignment marks) to a distance over which the wafer stage would be as accurate as a conventional optical overlay tool. This distance is typically <0.5 mm. When electrical alignment attributes are used for overlay. See Matching Management of multiple wafer steppers using a stable standard and a matching simulator, supra; Automated Electrical Measurements of Registration Errors in Step and Repeat Optical Lithography systems, supra; See Capacitor Circuit Structor For Determining Overlay Error, supra, the overlay metrology tool as utilized by this invention would correspond to the electrical equipment utilized for making the corresponding measurement.

Figure 37:
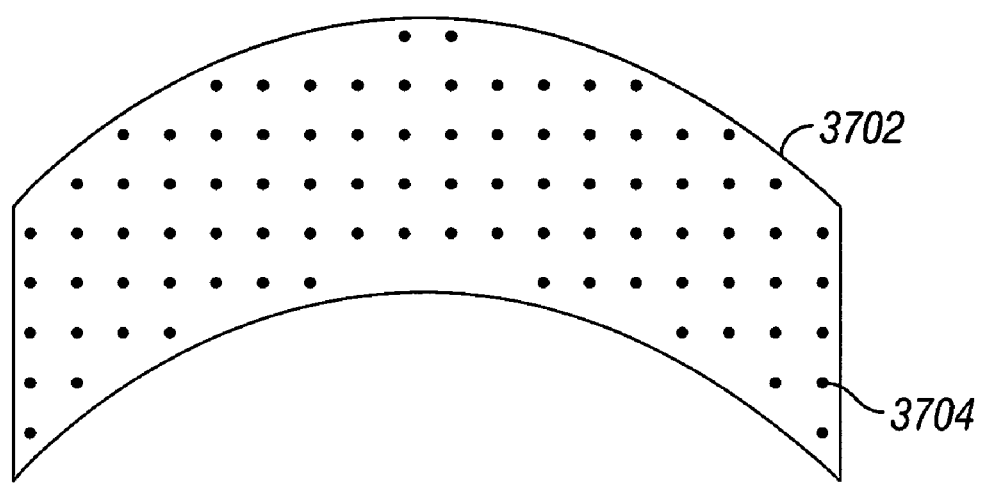
FIG. 37 is a schematic illustrating a curved image field.

In another example, the techniques described can be applied to curved image fields. FIG. 37 shows the outline of a curved projection field 3702 with alignment attribute sites indicated as dots 3704. An example where a curved projection field may be used is an Extreme Ultraviolet (EUV) projection system as described in System Integration and Performance of the EUV Engineering Test Stand, Tichenor, et. al., Proceedings of SPIE Vol. 4343 2001. As shown in FIG. 37, the curved projection field 3702 includes an array of approximately 18×5 alignment attribute sites, with 88 total sites, where the intra-field lens distortion is to be measured.

Figure 38:
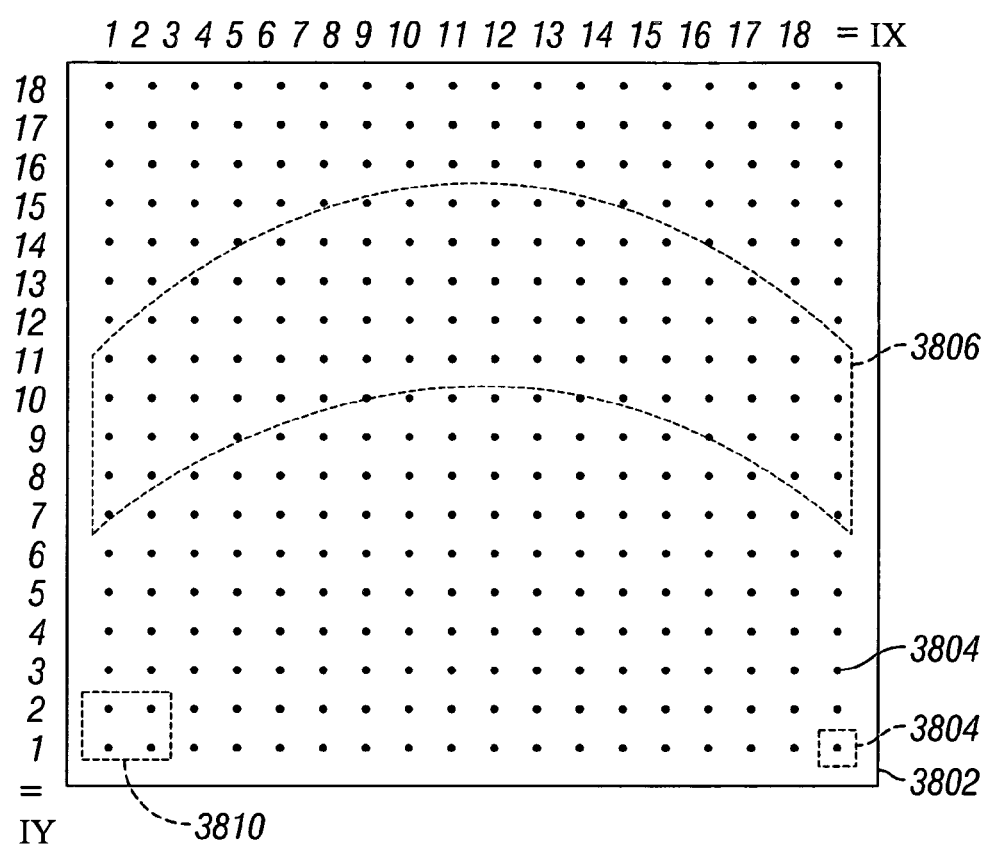
FIG. 38 is a schematic of a reticle.

FIG. 38 shows a reticle 3802 that includes overlay groups 3804 indicated by dots and the outline 3806 of the portion of this reticle utilized to print the curved projection field 3702. Utilizing the techniques described earlier, the curved projection field 3702 can be used to make X-shear and Y-shear fields. The position of the alignment attributes may then be measured and reconstructed to provide the intra-field lens distortion to within an overall translation, rotation, orthogonality, x-scale, and y-scale. The curved projection field 3702 can also be used to make X-shear, Y-shear, and R-shear (90 degree rotation) fields. Then, the position of the alignment attributes may then be measured and reconstructed to provide the intra-field lens distortion to within an overall translation, rotation, and scale.

Figure 39:
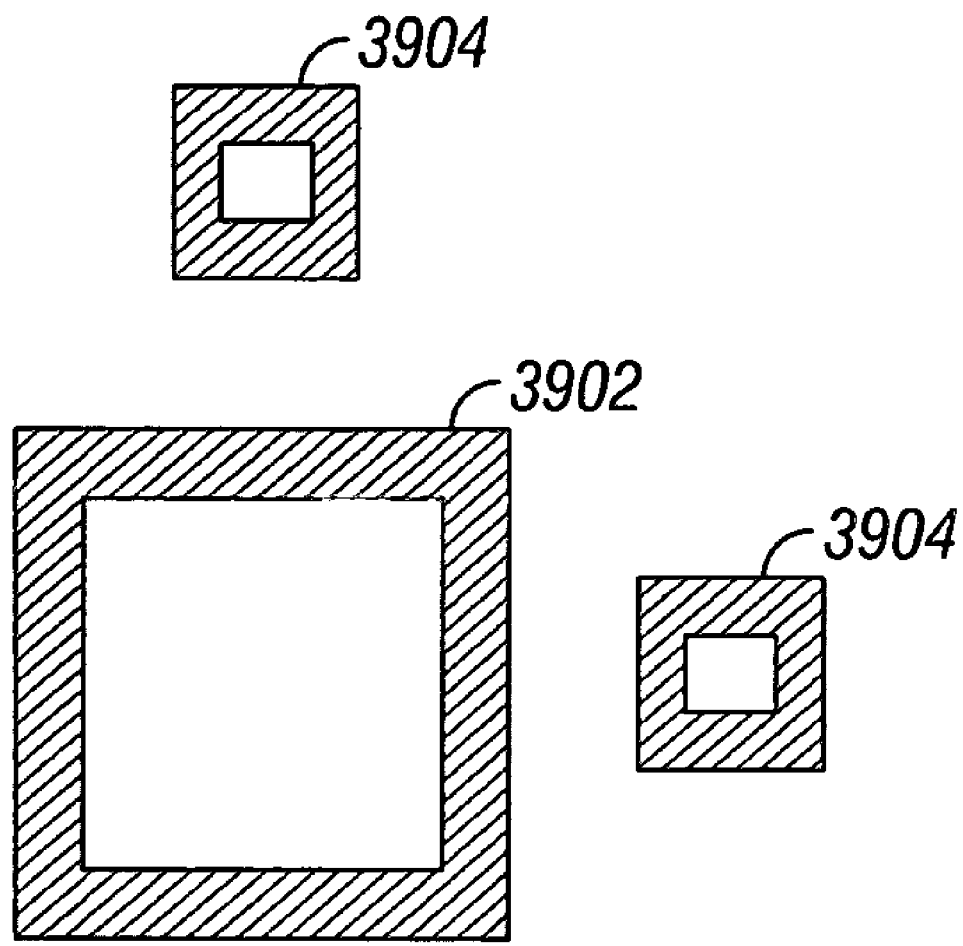
FIG. 39 is an illustration of a frame in frame overlay group.
Figure 40:
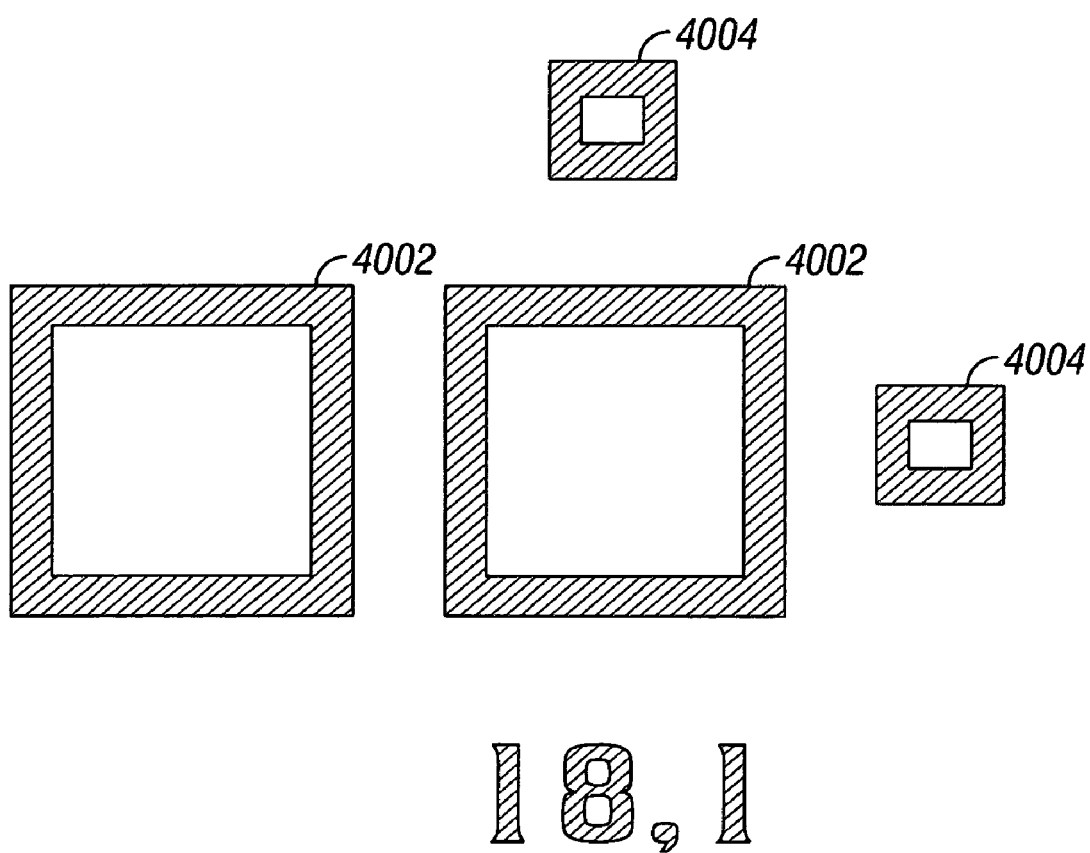
FIG. 40 is an illustration of a bar in bar overlay group.

FIG. 39 illustrates an example of an overlay group that can be used to make frame in frame, also referred to as bar in bar, alignment attributes. The example of the bar in bar overlay group shown in FIG. 39 includes one outer box 3902 pattern and two inner bar 3904 patterns. This particular overlay group is located in the lower right corner of reticle 3802, see FIG. 38. The numeration "18, 1" in FIG. 39 corresponds to the overlay group location IX=18, IY=1 on reticle 3802. This numeration is useful for verifying correct exposure patterns on the wafer. FIG. 40 illustrates another example of an overlay group that can be used to make bar in bar alignment attributes. The example of the bar in bar overlay group shown in FIG. 40 includes two outer bar 4002 patterns and two inner bar 4004 patterns. Again, this particular overlay group includes the numeration "18, 1" corresponding to the overlay group location IX=18, IY=1 on reticle 3802.

Figure 41:
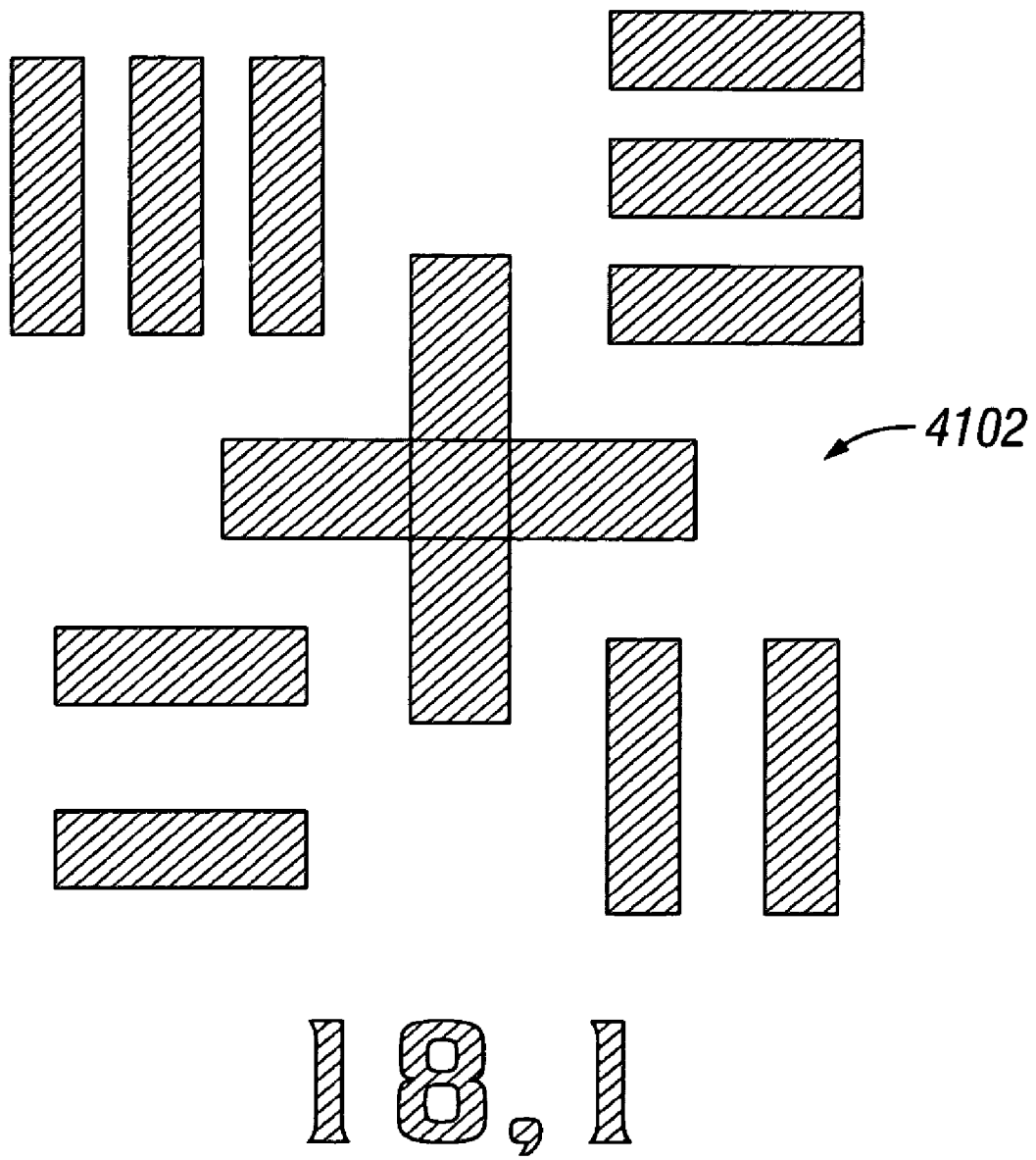
FIG. 41 is an illustration of a wafer alignment mark.

FIG. 41 illustrates an example of a Wafer Alignment Mark (WAM) 4102. Those of skill in the art will know that there are many different types of WAM with different configurations. The techniques described are not limited to any particular type or configuration of WAM and may be used with any WAM. The WAM illustrated in FIG. 41 includes the numeration "18, 1" corresponding to the overlay group location IX=18, IY=1 on reticle 3802, see FIG. 38.

The overlay groups illustrated in FIGS. 39, 40, and 41 can be used in many different types of projection systems. For example, for a dark field transmissive mask, the hatched regions in FIGS. 39, 40, and 41 represents openings in chrome while in a bright field transmissive mask, the hatched regions represent chrome. For reflective masks, such as would be used in a EUV projection system, the hatched regions represent reflective/non-reflective portions for dark/bright field mask or reticle.

Alternative Arrangements of Exposed Fields

Figure 42:
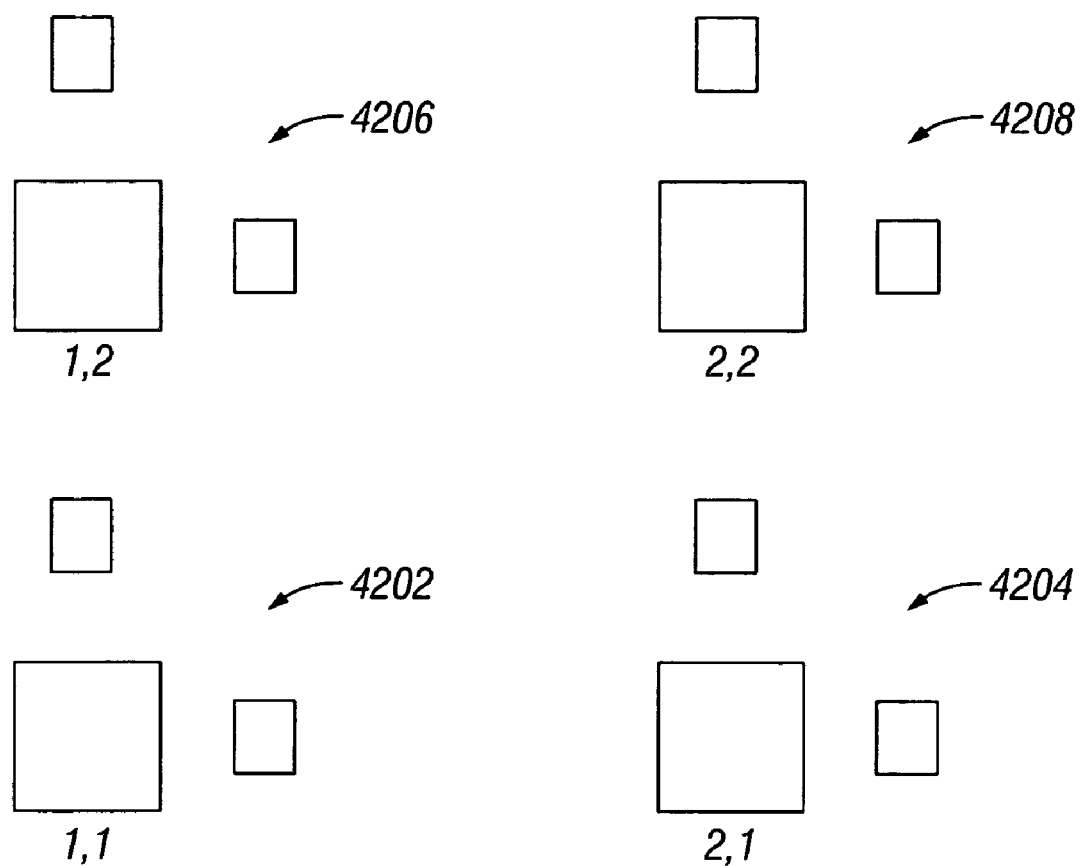
FIG. 42 is a schematic of an example of four overlay groups on a reticle.
Figure 43:
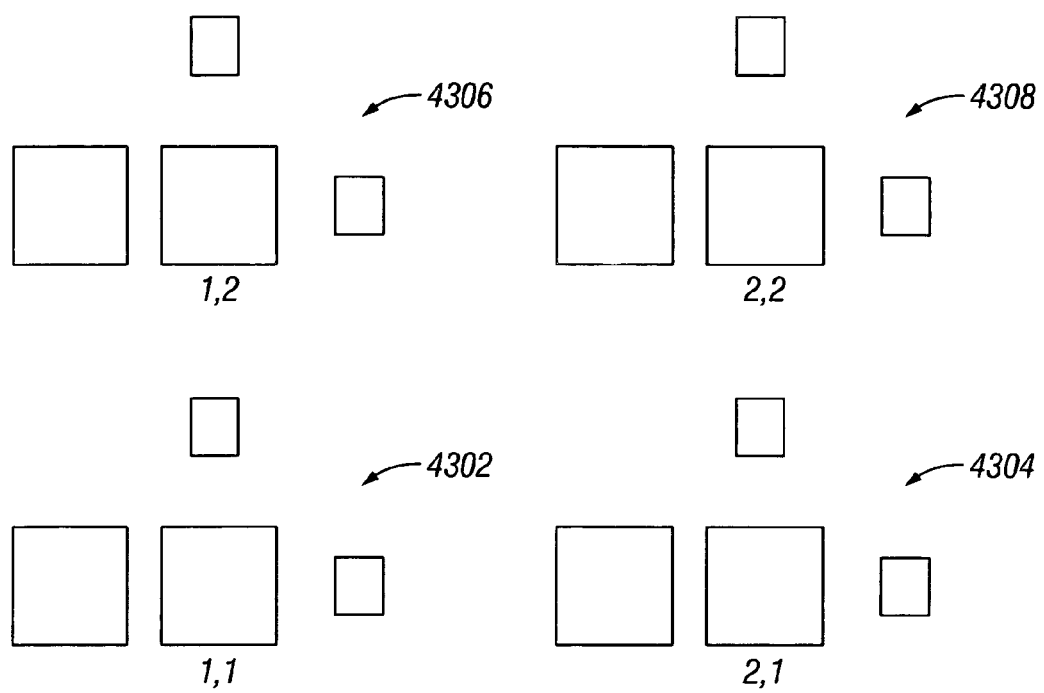
FIG. 43 is a schematic of another example of four overlay groups on a reticle.
Figure 44:
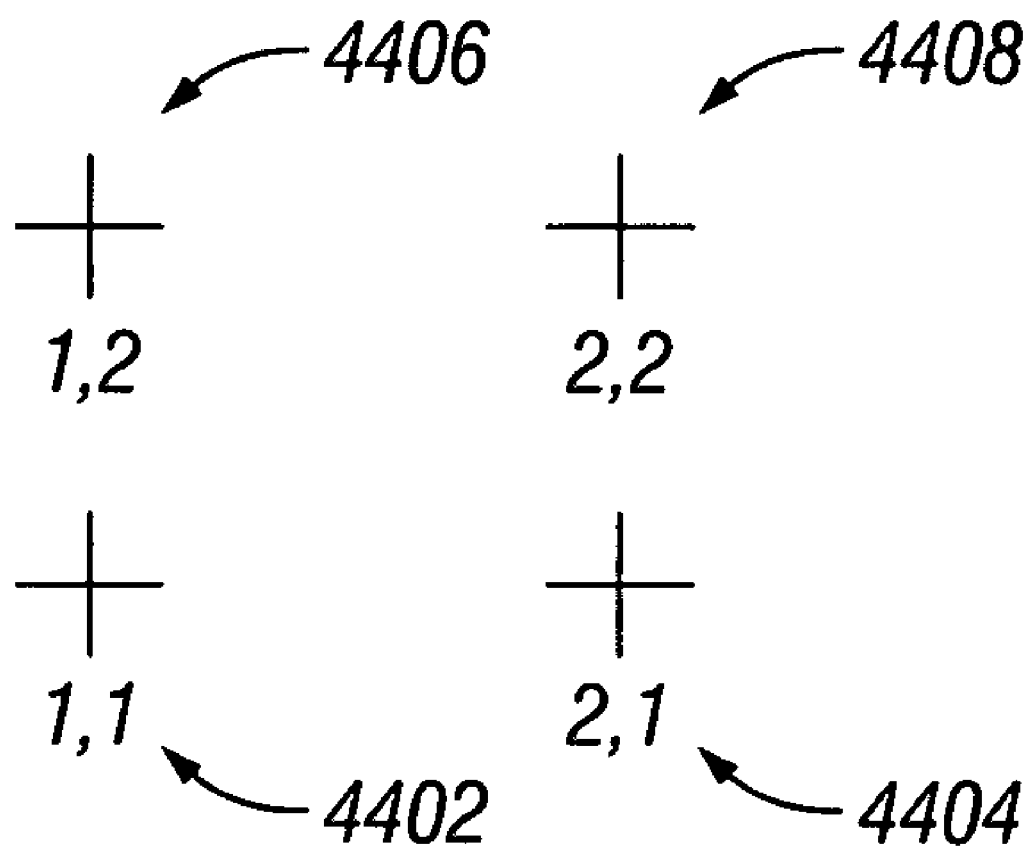
FIG. 44 is a schematic of yet another example of four overlay groups on a reticle.
Figure 45:
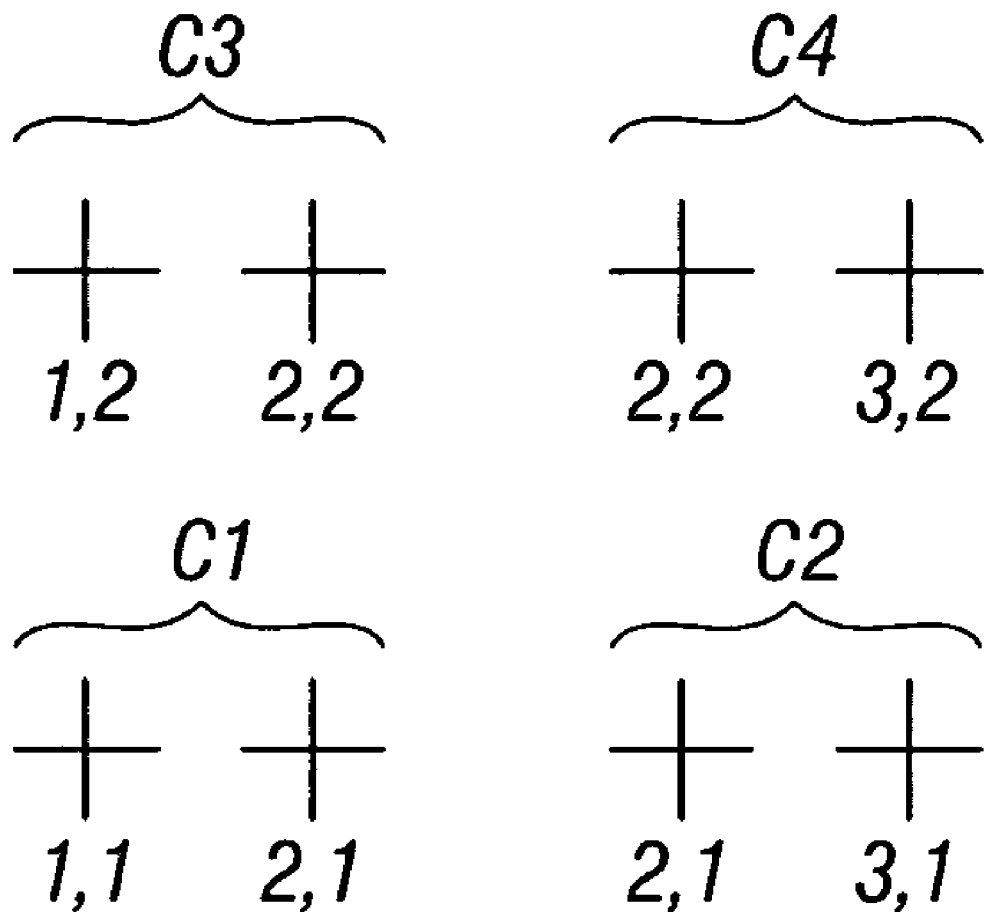
FIG. 45 is a schematic of four completed alignment attributes in an X shear pattern.

FIG. 42 is a schematic of four overlay groups 4202, 4204, 4206, 4208 located at the lower left corner of reticle 3802 enclosed by a dashed line 3810 in FIG. 38. The overlay groups shown in FIG. 42 are the bar in bar overlay group shown in FIG. 39 that includes one outer box pattern and two inner bar patterns. The four overlay groups 4202, 4204, 4206, and 4208 include numeration "1,1", "2,1", "1,2", and "2,2" respectively corresponding to the overlay group's location on the reticle. FIG. 43 is a schematic of four overlay groups 4302, 4304, 4306, 4308 located at the lower left corner of reticle 3802 enclosed by a dashed line 3810 in FIG. 38. The overlay groups shown in FIG. 43 are the bar in bar overlay group shown in FIG. 40 that includes two outer box patterns and two inner bar patterns. FIG. 44 is a schematic of four overlay groups 4402, 4404, 4406, 4408 located at the lower left corner of reticle 3802 enclosed by a dashed line 3810 in FIG. 38. The overlay groups shown in FIG. 44 are the overlay groups shown in FIG. 4 that includes WAMs. In FIG. 44 each of the WAMS, as illustrated in FIG. 41, are represented by a single "cross" pattern for clarity Reticles with overlay groups as illustrated in FIGS. 42, 43, and 44 can be used with the techniques described herein. For example, using the reticle with WAMs, as illustrated in FIG. 44, can be used to make X-shear fields as described in the discussion of FIG. 35. Using a reticle as illustrated in FIG. 44, two exposures can create an X-shear pattern as shown in FIG. 35. FIG. 45 illustrates a portion of an X-shear pattern created with the reticle of FIG. 44.

FIG. 45 shows four completed alignment attributes C1–C4 in an X-shear pattern. The completed alignment attributes can be made using various exposure techniques. For example, in a first exposure a wafer can be aligned relative to the reticle such that WAM "2,1" is exposed on a region of the wafer corresponding to alignment attribute C1. Likewise, during the first exposure WAMs "3,1", "2,2", and "3,2" are exposed onto regions of the wafer corresponding to alignment attributes C2, C3, and C4 respectively. The wafer and reticle are then repositioned relative to each other and a second set of WAMs are exposed onto the wafer. In the example shown in FIG. 45, the wafer and reticle have be realigned so that during the second exposure WAM "1,1" is exposed onto the region of the wafer corresponding to alignment attribute C1. Likewise WAMs. "2,1". "1,2" and "2,2" are exposed onto regions of the wafer corresponding to alignment attributes C2, C3, and C4. Those skilled in the art will recognize that the order that the WAMs are exposed is not important. For example, in making alignment attribute C1 WAM "1,1" could have been exposed first and then WAM "2,1" exposed.

After an X-shear pattern, such as the portion of one illustrated in FIG. 45, is made the completed alignment attributes can be measured, and reconstructed to provide intra-field lens distortion, as described earlier. In general, an exposure tool includes a wafer alignment mark subsystem that is used to align wafers during operation. The exposures tool wafer alignment mark subsystem can also be used to measure the displacement between wafer alignment marks (WAM) within each completed alignment attribute, C1–C4 shown in FIG. 45. For example, and referring to FIG. 45, completed alignment attribute C1 would be measured by measuring the position of WAM "1,1" (measured position= (X,Y)(1,1)) and then measuring the position of WAM "2,1" (measured position=(X,Y)(2,1)). The net measured quantity (BBx,BBy)(1,1;X) utilized in equations 5 and 6 above is:

$$(BBx,BBy)(1,1;X)=(X,Y)(2,1)-(X,Y)(1,1) \qquad \text{(eq 44)}.$$

Creating Y-shear and R-shear patterns have analogous arrangements and measurement schemes. As a result, the lithography tool's wafer alignment mark measurement subsystem can be used to collect measurements for the techniques described. Thus, the techniques described can be incorporated into lithography tools, both steppers and scanners, with no hardware modifications to the lithography tools.

Figure 46:
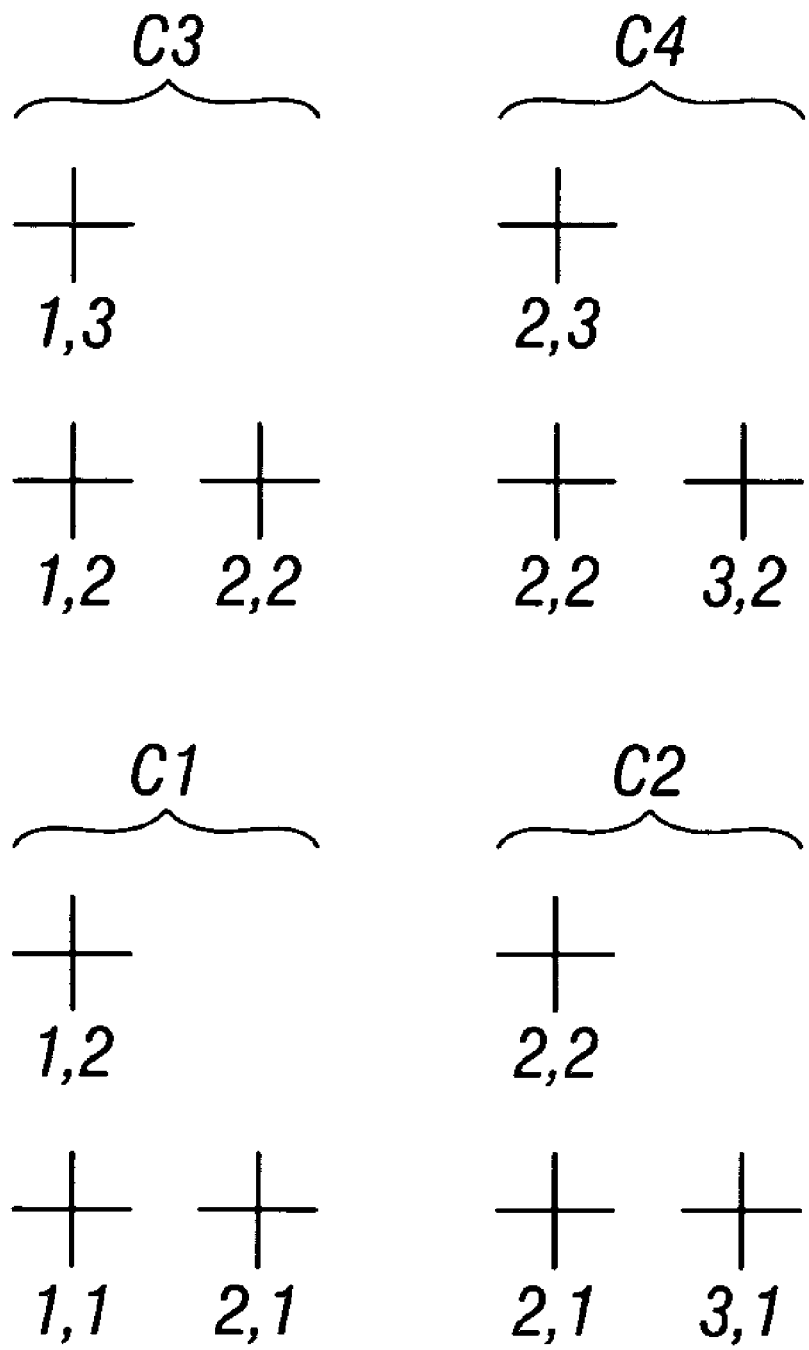
FIG. 46 is a schematic of four completed alignment attributes in a combined X shear and Y shear pattern.

FIG. 46 illustrates an additional aspect of the invention. FIG. 46 shows a portion of an exposure field including X-shear and Y-shear patterns made with WAM's. In the technique illustrated in FIG. 46, instead of exposing the X-shear and Y-shears patterns as separate fields, the two are combined. Combining X-shear and Y-shear patterns into a single field has an advantage that the combined wafer flatness and wafer side non-telecentricity effects that produce errors (wafer $\Delta Z^*\theta\_telecentricity$) are minimized because both X and Y shear patterns are measured at the same wafer height (same completed alignment attribute site C1).

An additional advantage is that instead of having two offsets within each completed alignment attribute, as illustrated in FIG. 45, in this technique there are three offsets within each completed alignment attribute. The three offsets will be linearly related and thereby allow for further reduction in reconstruction error. For example, in completed alignment attribute C1 of FIG. 46, the X-shear measurement is:

$$(BBx, BBy)(1,1;X)=(x,y)(2,1)-(x,y)(1,1) \qquad \text{(eq 45)}$$

where:

(x,y)(2,1)=measured position of wafer alignment mark "2, 1"

(x,y)(1,1)=measured position of wafer alignment mark "1, 1" using the same notation as in equations 5 and 6 above.

Similarly, and using the same notation as in equations 7 and 8 above, the Y-shear measurement is:

$$(BBx, BBy)(1,1;Y)=(x,y)(1,2)-(x,y)(1,1) \qquad \text{(eq 46)}$$

where:

(x,y)(1,2)=measured position of wafer alignment mark "1, 2".

Because the lithography machine's wafer alignment system is being used to independently measure the positions of the three alignment WAM's of C1, the 135 degree shear measurement can also be made:

$$(BBx, BBy)(1,1;135)=(x,y)(1,2)-(x,y)(2,1) \qquad \text{(eq 47)}.$$

Neglecting stage translation and rotation, the X and Y shears of Equations 45 and 46 are related to the lens distortion according to Equations 5, 6, 7, and 8 as:

$$(BBx,BBy)(1,1;X)=(dxf(2,1)-dxf(1,1),$$
$$dyf(2,1)-dyf(1,1)) \qquad \text{(eq 4)}$$

and $$(BBx, BBy)(1,1;Y) = (dxf(1,2) - dxf(1,1), dyf(1,2) - dyf(1,1))) \qquad \text{(eq 4)}$$

while the 135 degree shear measurement will be related to the lens distortion as:

$$(BBx, BBy)(1,1;135) = (dxf(1,2) - dxf(2,1), dyf(1,2) - dyf(2,1))) \qquad \text{(eq 50)}.$$

This construction of X, Y, and 135 degree shears can generally be carried over to the other completed alignment attributes (C2, C3, C4, . . . ) with possible exceptions coming along the outer periphery of the array of completed alignment attributes. The reconstruction of lens distortion (dxf, dyf) proceeds as described above, but with the addition of the 135 degree shear measurement set. The result of this reconstruction is a better, lower noise estimate of lens distortion than by using the X and Y shears only.

Figure 47:
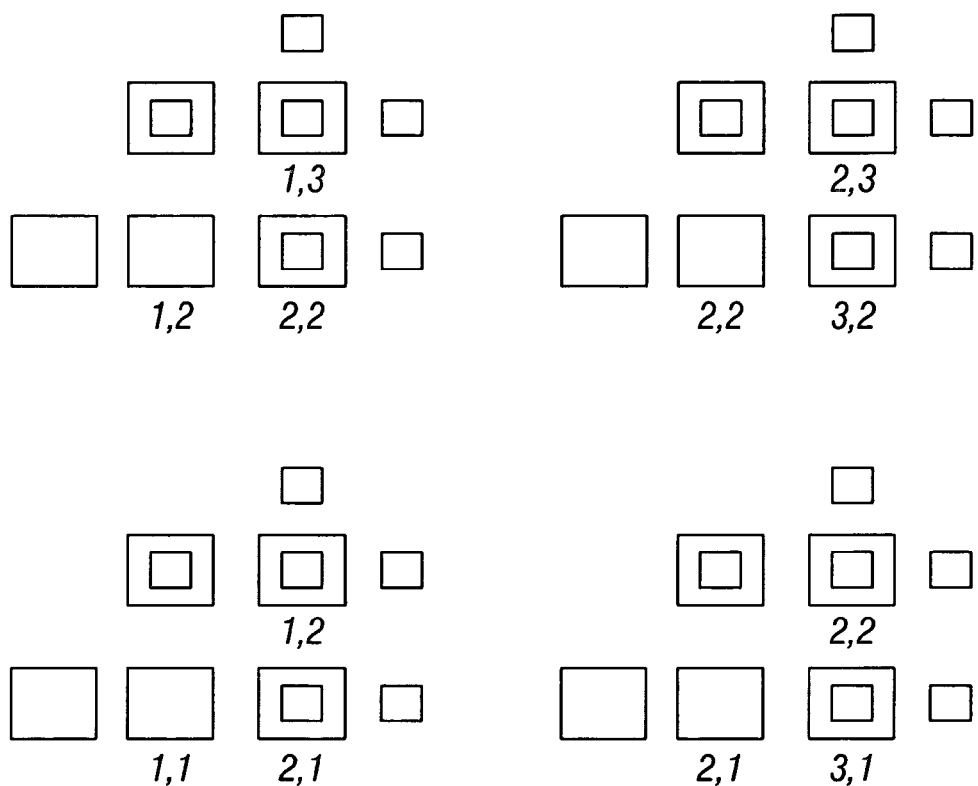
FIG. 47 is a schematic of another example of four completed alignment attributes in a combined X shear and Y shear pattern.

Combining X, Y, and 135 degree shears in a single field can also be implemented with bar in bar type completed alignment attributes. FIG. 47 illustrates bar in bar overlay groups, as illustrated in FIG. 40, arranged on a reticle. as shown in FIG. 43, such that combined X, Y, and 135 degree shear patterns can be produced in three exposures. Using completed alignment attribute C1 as an example, by measuring all three completed bar in the bar patterns, the X, Y and 135 degree shear measurements are obtained. Measuring the remaining alignment attributes and reconstructing as described above produces the intra-field lens distortion.

Another example arrangement that combines only X and Y shear exposure fields is shown in FIG. 48. The exposure fields are created with three exposures of the reticle with the overlay groups shown schematically in FIG. 42. The completed bar in bar patterns are then measured and the result reconstructed, as described earlier, to produce the intra-field lens distortion. An advantage of this arrangement is to minimize the influence of wafer height variations combined with lens non-telecentricity.

Yet another example arrangement that combines X, Y, R (90 degree), 135 degree, and other shears is shown in FIG. 49. Four WAMs, resulting from 4 separate exposures, make up the completed alignment attributes C1, C2, C3, and C4. The wafer alignment mark measurement subsystem of the lithography tool then measures the position of each of the four WAMs in a completed alignment attribute resulting in six unique differences being computed. These 6 differences contain those of Equations 45, 46, and 47 plus the differences resulting from the rotated WAM ("18,1" in C1) and the remaining three WAMs. The relation between these three additional differences can be formulated in terms of the intra-field lens distortion analogously to Equations 48, 49, and 50. The resulting set of equations can then solved for the intra-field lens distortion.

Figure 50:
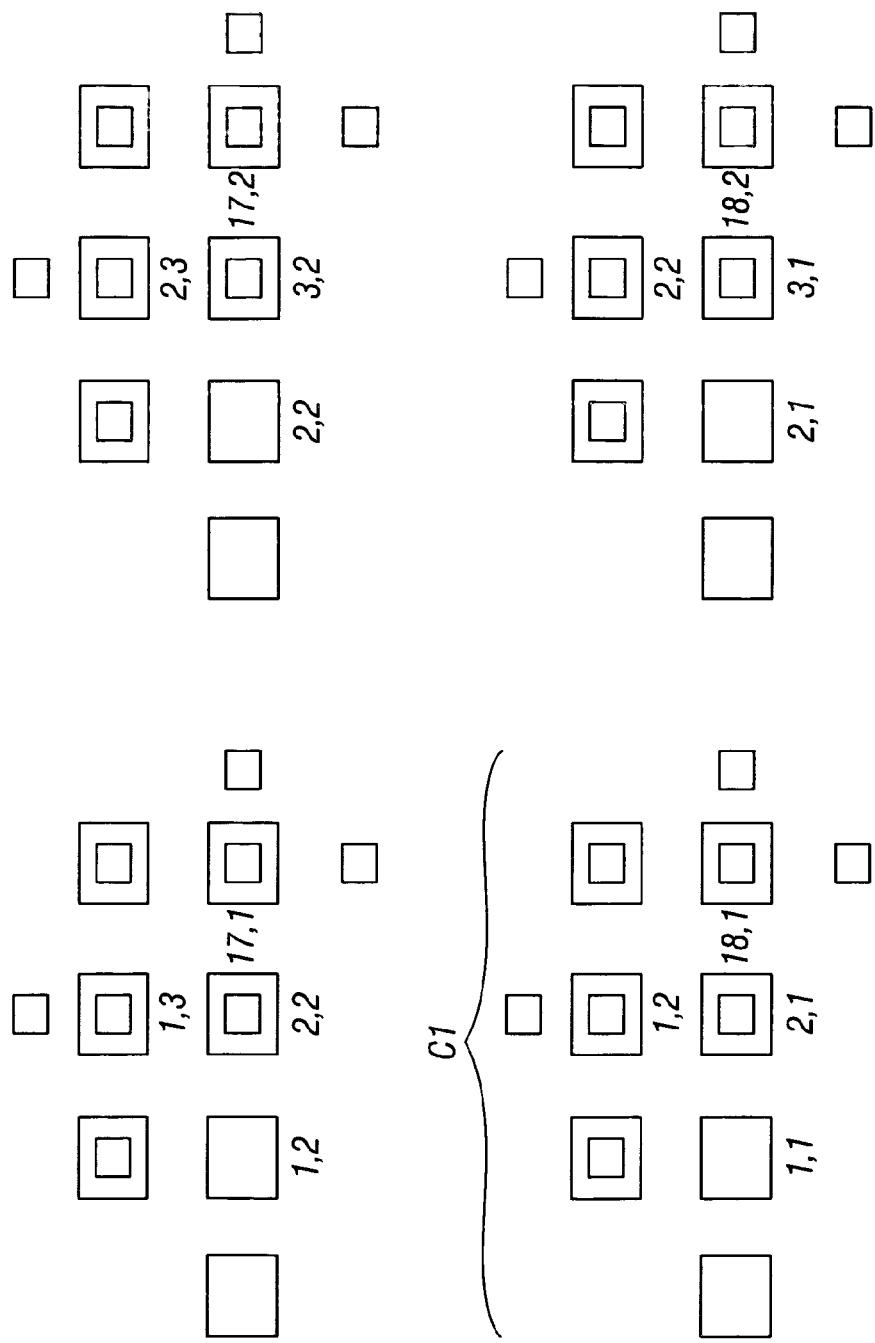
FIG. 50 is a schematic of another example of four completed alignment attributes in a combined X shear, Y shear, and R shear pattern.

A similar arrangement utilizing bar in bar structures that combines X, Y, R, 135 degree, and one additional shear is shown in FIG. 50. A reticle, as shown in FIG. 43, that has bar in bar overlay groups, as illustrated in FIG. 40, can be used to create a pattern as illustrated in FIG. 50. As show, within each of the completed alignment attribute C1–C4, there are five completed bar in bar overlay marks that can be measured These measurements can be used, as described above, to solve for the intra-field lens distortion.

As mentioned above, intrafield overlay errors are related to lens aberrations. Intrafield overlay error is also dependent on the geometry of the mask feature and the form of the illumination. See Pattern Displacement Error Under Off Axil Illumination, N. Seong et al., *Jpn. J. Appl. Phys.*, Vol. 37 (1998), pp. 6695–6697. Conventional and quadupole illumination can be used to expose a large isolated feature characteristic such as standard overlay targets (size≈2 micron), contact hole (0.81 μm, dense), and bit line (0.4 μm, dense) patterns on the same lithographic projection tool. Different distortion (dx,dy) can be measured for each feature and this distortion can be attributed to the combined effect of the source and the mask spatial frequency sampling differing portions of the exit pupil with a varying strength. The x and y-tilt Zernike coefficients (a2,a3) contributor to intrafield lens distortion are responsible for a portion of the total phase aberration:

$$\Phi TT(nx, ny) = a2 \frac{2nx}{NA} + a3 \frac{2ny}{NA} \qquad \text{(eq 51)}$$

where;

$\Phi TT(nx,ny)$=phase aberration due to x-tilt and y-tilt nx,ny=x, y direction cosines in the wafer plane NA=numerical aperture of the projection imaging system exit pupil a2,a3=x, y tilt Zernike coefficients.

Independent of the mask (feature) geometry and illumination source, the shift induced by x and y tilt is:

$$(dx^*, dy^*) = \left(-a2\frac{\lambda}{\pi NA}, -a3\frac{\lambda}{\pi NA}\right) \qquad \text{(eq 52)}$$

where:

$\lambda$=the wavelength of the illumination source a2,a3=x, y tilt Zernike coefficients expressed in units of radians (dx*, dy*)=that portion of the shift attributable to x and y tilt only.

The effects noted in "Pattern Displacement Error Under Off Axis Illumination", supra are not due to a2, a3 but instead to higher order projection imaging tool phase aberrations, so expressing the high order aberrations, ΦH0, as a sum of Zernike polynomials, $$Z_j\left(\frac{nx}{NA}, \frac{ny}{NA}\right)$$

(See "Impact of Lens Aberrations on Optical Lithography", T. A. Brunner, KLA 1996, pp. 1–27) and coefficients $a_j$, j=4:N results in $$\Phi HO(nx, ny) = \sum_{j=4}^{N} a_j Z_j\left(\frac{nx}{NA}, \frac{ny}{NA}\right) \qquad \text{(eq 53)}$$

The higher order Zernike coefficients (a4,a5. . . ), the illumination profile (denoted ILP), and the exact mask pattern (denoted MP) combine to create a shift (dxH,dyH) with the dependence:

$$(dxH, dyH) \, (a4:aN, ILP, MP) \qquad \text{(eq 54)}$$

If the higher order Zernike coefficients a4:aN are known, for example, by measuring with the device and process of U.S. Pat. No. 5,978,085, the details of illumination profile ILP (for example by measuring with the device and process of "Litel Source Metrology Instrument" or from the nominal setting valve), and the mask pattern, MP, for example, known from the detail design and possibly measurements of the overlay reticle, then dxH,dyH of Equation 54 can be calculated. (See 3D Modelling of High Numerical Aperture Imaging in Thin Films, D. G. Flagello, *SPIE, Vol. 1625 Design Modeling, and Control of Laser Beam Optics* (1992), pp. 246–261). Determining the higher order distortion, (dxH, dyH), in the manner described, the x and y tilt Zernike coefficients a2,a3 can be calculated as:

$$(a2, a3) = -\pi \cdot \frac{NA}{\lambda}(dx - dxH, dy - dyH) \quad \text{(eq 55)}$$

where:
(dx, dy)=intrafield distortion as recorded by method of this invention (e.g. Table 36).

By carrying out the following additional steps the x and y tilts (a2, a3) can be determined:
1) Provide intrafield distortion dx,dy per Table 36.
2) Provide higher order Zernike coefficients a4:aN and the NA they were measured at.
3) Provide illumination profile characterization (ILP) used in carrying out the exposures for step number 1.
4) Provide the mask pattern (MP) used on the overlay reticle for carrying out the exposures for step number 1.
5) Provide the exit pupil numerical aperture NA or the detailed exit pupil transmission map TXP (nx,ny) used for carrying out the exposures in step number 1, call this XPP.
6) Provide the projection imaging tool wavelength λ.
7) Calculate the higher order contributions to the intrafield lens distortion. These are a function of λ, a4:aN, ILP, MP and XXP and will in general be different at each field point xf,yf. These higher order contributions to the intrafield lens are referred to as $$(dxH, dyH)(xf, yf) \quad \text{(eq 56)}$$

8) Compute the x and y tilt as:

$$(a2, a3)(xf, yf) = \\ -\pi\frac{NA}{\lambda}(dx(xf, yf) - dxH(xf, yf), dy(xf, yf) - dyH(xf, yf)) \quad \text{(eq 57)}$$

The final result of these additional steps is shown in FIG. 51 which shows a tabular delineation of x and y tilt as a function of intrafield position.

The techniques have been mainly described with respect to it's application on the projection imaging tools such as photolithographic stepper systems See Direct-referencing automatic two-points reticle-to-wafter alignment using a projection column servo system, supra; New 0.54 Aperture I-Line Wafer Stepper With Field by Field Leveling Combined with Global Alignment, M. Van den Brink, B. Katz, S. Wittekoek, SPIE Vol. 1463, 709:724, 1991; Projection optical system for use in precise copy, T. Sato, et al., U.S. Pat. No. 4,861,148, 1989, and photolithographic scanners systems. See Micrascan (TM) III performance of a third generation, catadioptric step and scan lithographic tool, D. Cote, et al., SPIE Vol. 3051, 806:816, 1997; ArF Step And Scan Exposure System For 0.15 Micron and 0.13 micron Technology Node, J. Mulkens, et al., SPIE Conference on Optical Microlithography XII, 506:521, March, 1999; 0.7 NA DUV step and Scan system for 150 nm Imaging with Improved Overlay, supra]) most commonly used in semiconductor manufacturing today. The techniques can be applied to other projection imaging tools such as contact or proximity printers. See Optical Lithography—Thirty years and three orders of magnitude, supra, 2-dimensional scanners; See Large-area, High-throughout, High-Resolution Projection Imaging System, K. Jain, U.S. Pat. No. 5,285,236, 1994, Optical Lithography—Thirty years and three orders of magnitude, supra, office copy machines, and next generation lithography (ngl) systems such as XUV. See Development of XUV projection lithography at 60–80 nm, supra, SCALPEL, EUV (Extreme Ultra Violet); See Reduction imaging at 14 nm using multilayer-coated optics: Printing of features smaller than 0.1 micron ef 53, supra, IPL (Ion Projection Lithography), and EPL (electron projection lithography). See Mix-And-Match: A necessary Choice, supra. In addition, the techniques can be applied to a lithographic projection system used in an electron beam imaging system, or a direct write tool, or an x-ray imaging system.

The reticle of the present invention is typically glass with openings defined in a chrome coating. This is common for projection lithography tools utilized in semiconductor manufacture. The form the reticle can take will be determined by the format required by the specific projection lithography tool on which the reticle is loaded.

The techniques have been mainly described with respect to the recording medium being positive photoresist. The technique could equally well have used negative photoresist providing appropriate adjustment to the box in box structures on the reticle are made. In general, the recording medium is whatever is typically used on the lithographic projection tool being measuring. Thus, on an EPL tool, an electron beam resist such as PMMA could be utilized as the recording medium.

So far, the substrates on which the recording media is placed have been described as semi conductor surfaces or silicon wafers. This will be the case in semiconductor manufacture. The exact form of the substrate will be dictated by the projection lithography tool and its use in a specific manufacturing environment. For example, in a flat panel manufacturing facility, the substrate on which the photoresist would be placed would be a glass plate or panel. A projection imaging tool used in mask making would utilize a reticle, or a photolithographic mask, as the substrate. In addition, the substrate may be an electronic recording media, or an optically sensitive material, such as an electronic CCD, a diode array, or a liquid crystal material. Circuit boards or multi-chip module carriers are other possible substrates.

The overlay measurement and lens distortion algorithm can also be integrated directly into the exposure alignment systems of most stepper and scanner systems. For example, this could be in the form of an electronic sensing array embedded in the wafer chuck that would serve as both substrate and recording medium.

The present invention has been described above in terms of a presently preferred embodiment so that an understanding of the present invention can be conveyed. There are, however, many configurations for ownership interest award techniques not specifically described herein but with which the present invention is applicable. The present invention should therefore not be seen as limited to the particular embodiments described herein, but rather, it should be understood that the present invention has wide applicability with respect to ownership interest award techniques generally. All modifications, variations, or equivalent arrange-

We claim:

1. A method of determining intra-field distortion in a projection imaging tool, the method comprising:
   producing an exposure of a reticle pattern on a substrate with a recording media in a first position, wherein the reticle pattern includes at least one array of alignment attributes;
   producing an exposure of the reticle pattern on the substrate in a second position, wherein the exposure of the reticle pattern in the second position is shifted in a desired direction by a desired amount, wherein an alignment attribute exposed during the first exposure and an alignment attribute exposed during the second exposure form a completed alignment attribute;
   measuring positional offsets of the alignment attributes in the completed alignment attribute; and
   determining a lens distortion map from the resulting positional offsets.

2. A method as defined in claim 1, wherein the alignment attributes are wafer alignment marks.

3. A method as defined in claim 2, wherein measuring of the positional offsets is performed by a lithography tool wafer alignment mark measurement system.

4. A method as defined in claim 1, wherein the desired direction corresponds to an X direction.

5. A method as defined in claim 1, wherein the desired direction corresponds to a Y direction.

6. A method as defined in claim 1 wherein the at least one array of alignment attributes further comprises a first and a second array of alignment attributes wherein the first and second arrays of alignment attributes have features complementary to each other and the arrays have the same pitch and are offset from each other.

7. A method as defined in claim 6, wherein the reticle pattern in the second position is shifted so that the second exposure of the array of alignment attributes overlay the first exposure of the array of alignment attributes thereby forming a completed alignment attribute.

8. A method as defined in claim 7, wherein the completed alignment attribute comprises a box in box alignment attribute.

9. A method as defied in claim 7, wherein the completed alignment attribute comprises a frame in frame alignment attribute.

10. A method as defined in claim 7, wherein the completed alignment attribute comprises gratings.

11. A method as defined in claim 7, wherein the completed alignment attribute comprises vernier pairs.

12. A method as defined in claim 7, wherein the completed alignment attribute comprises Van der Pauw resistors.

13. A method as defined in claim 7, wherein the completed alignment attributes comprise capacitor structures.

14. A method as defined in claim 1, wherein the reticle pattern is a curved field.

15. A method of determining intra-field distortion in a projection imaging tool, the method comprising:
   producing an exposure of a reticle pattern on a substrate with a recording media in a first position, wherein the reticle pattern includes at least one array of alignment attributes;
   producing an exposure of the reticle pattern on the substrate in a second position, wherein the exposure of the reticle pattern in the second position is shifted in a desired direction by a desired amount, wherein an alignment attribute exposed during the first exposure and an alignment attribute exposed during the second exposure form a completed alignment attribute;
   measuring positional offsets of the alignment attributes in the completed alignment attribute; and
   determining a lens distortion map from the resulting positional offsets, wherein x-tilt and y-tilt Zernike coefficients of the projection imaging system are determined.

16. A method as defined in claim 15, wherein determining the x-tilt and y-tilt Zernike coefficients further includes determining Zernike coefficients at an order a4 or above.

17. A method of determining x-tilt and y-tilt Zernike coefficients in a projection imaging tool, the method comprising:
   producing an exposure of a reticle pattern on a substrate with a recording media in a first position, wherein the reticle pattern includes at least one array of alignment attributes;
   producing an exposure of the reticle pattern on the substrate in a second position, wherein the exposure of the reticle pattern in the second position is shifted in a desired direction by a desired amount, wherein an alignment attribute exposed during the first exposure and an alignment attribute exposed during the second exposure form a completed alignment attribute;
   measuring positional offsets of the alignment attributes in the completed alignment attribute;
   determining a lens distortion map from the resulting positional offsets; and
   determining the x-tilt and y-tilt Zernike coefficients from the lens distortion map.

18. A method as defined in claim 17, wherein determining the x-tilt and y-tilt Zernike coefficients further includes determining Zernike coefficients at an order a4 or above.

19. A method of determining intra-field distortion in a projection imaging tool, the method comprising:
   providing an illumination source with a curved projection field;
   producing an exposure of a curved field reticle pattern on a substrate with a recording media in a first position, wherein the reticle pattern includes at least two arrays of alignment attributes, the arrays of alignment attributes having features complementary to each other and the arrays have the same pitch and are offset from each other;
   producing an exposure of the curved field reticle pattern on the substrate in a second position, wherein the exposure of the reticle pattern in the second position overlaps the reticle pattern in the first position and is shifted in a desired direction an amount that corresponds to the offset;
   measuring positional offsets of the alignment attributes; and
   determining a lens distortion map from the resulting positional offsets.

20. A method as defined in claim 19, wherein the complementary features of the at least two arrays of alignment attributes form a box-in-box attribute.

21. A method as defined in claim 19, wherein the complementary features of the at least two arrays of alignment attributes form a frame-in-frame attribute.

22. A method as defined in claim 19, wherein the complementary features of the at least two arrays of alignment attributes comprise gratings.

23. A method as defined in claim 19, wherein the at least two arrays of alignment attributes comprise wafer alignment marks.

24. A method as defined in claim 23, wherein measuring of the positional offsets is performed by a lithography tool wafer alignment mark measurement system.

25. A method as defined in claim 19, wherein the at least two arrays of alignment attributes comprise Van der Pauw resistors.

26. A method as defined in claim 19, wherein the at least two arrays of alignment attributes comprise vernier pairs.

27. A method as defined in claim 19, wherein the at least two arrays of alignment attributes comprise capacitor structures.

* * * * *

UNITED STATES PATENT AND TRADEMARK OFFICE
CERTIFICATE OF CORRECTION

PATENT NO. : 7,099,011 B2
APPLICATION NO. : 10/727081
DATED : August 29, 2006
INVENTOR(S) : McArthur et al.

It is certified that error appears in the above-identified patent and that said Letters Patent is hereby corrected as shown below:

IN THE SPECIFICATION

Figure 1:
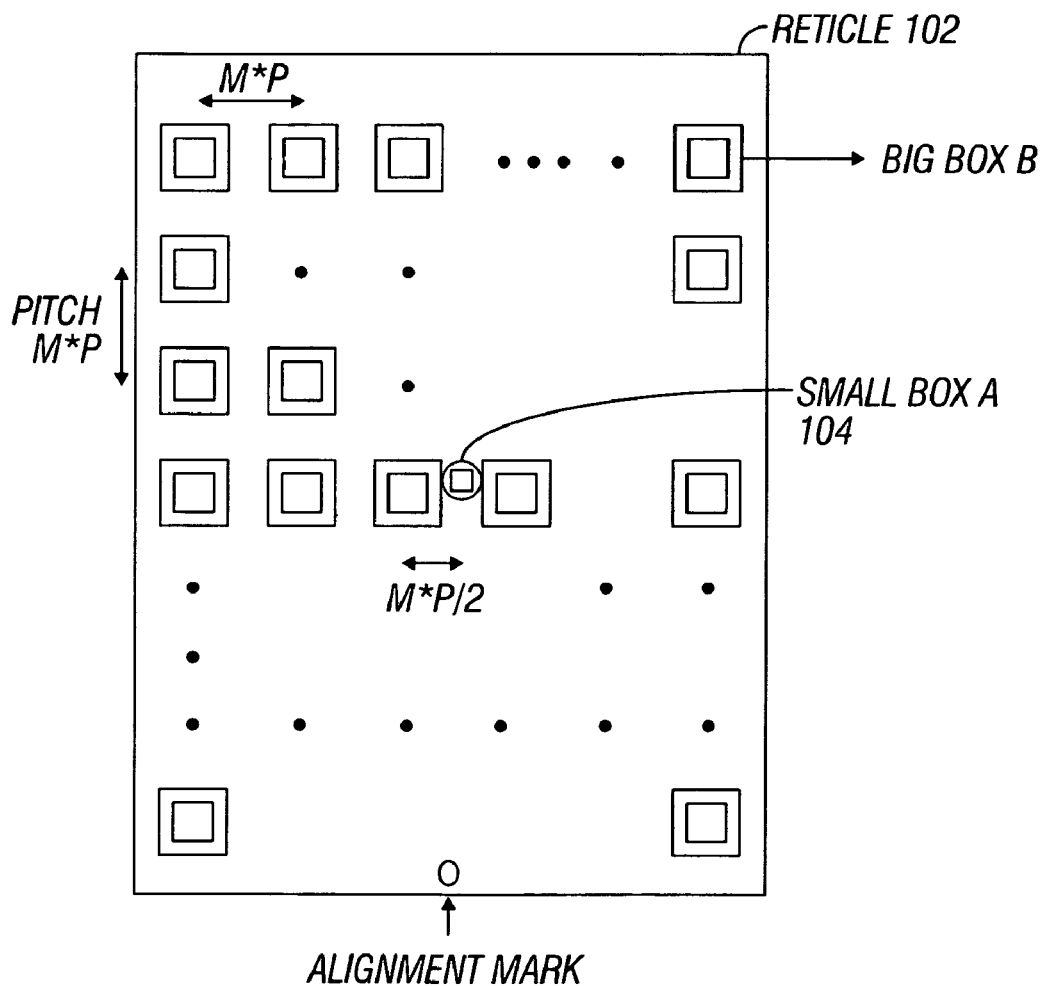
FIG. 1 shows a reticle schematic.
Figure 21:
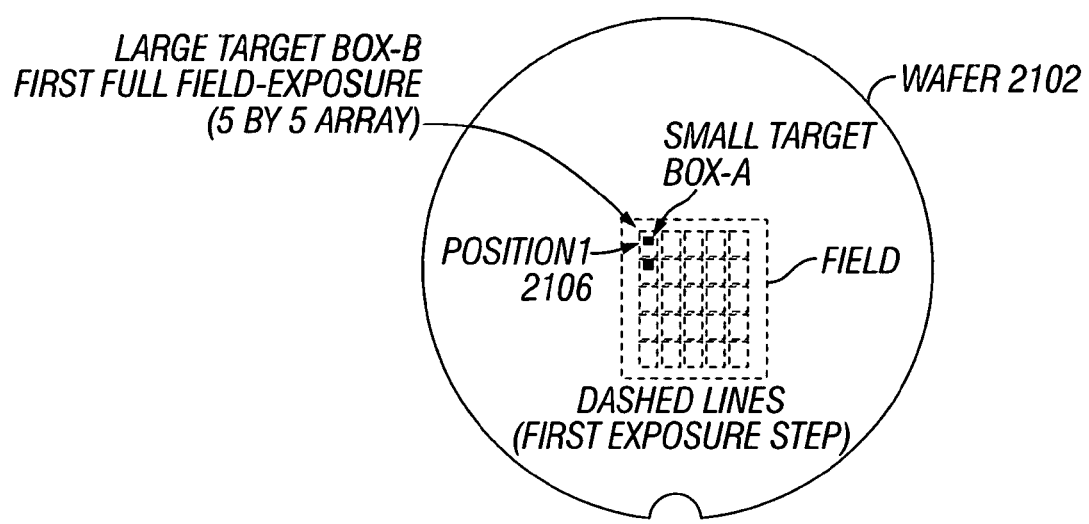
FIG. 21 is an example of a prior art lens distortion test.

Column 3, line 32 to column 4, line 4, please amend as follows:

--Semiconductor manufacturing facilities generally use some version of the following complex overlay procedure to help determine the magnitude of lens distortion independent of other sources of systematic overlay error. The technique has been simplified for illustration. *See* Analysis of image field placement deviations of a 5x microlithographic reduction lens, D. MacMillan, et al., SPIE Vol. 334, 78:89, 1982. FIGS. 2 and 3 show typical sets of overlay targets 300, including – one large or outer box 302 and one small or inner target box 304. FIG. 1 shows a typical portion of a distortion test reticle 102 used in the prior art. It should be noted that the chrome target patterns on most reticles are 4 or 5 times larger as compared with the patterns they produce at the image ~~plane,~~ plane: this simply means modem steppers are reduction systems. Further, for purposes of discussion, it is assumed that the reticle pattern is geometrically perfect, (in practice, the absolute positions of features on the reticle can be measured and the resulting errors subtracted off). First, a wafer covered with photoresist is loaded onto the wafer stage and globally aligned. Next, the full-field image of the reticle, 102 in FIG. 1 is exposed onto the resist-coated wafer 2102 in FIG. 21. For purposes of illustration, we assume that the distortion test reticle consists of a 5 x 5 array of outer boxes evenly spaced a distance M*P, across the reticle surface see FIG. 1. It is typically assumed that the center of the optical system is virtually aberration free. *See* Analysis of image field placement deviations of a 5x microlithographic reduction lens, *supra*. With this assumption, the reticle, 102 in FIG. 1 is now partially covered using the reticle blades, 1704 in FIG. 17, in such a way that only a single target at the center of the reticle field, box 104, in FIG. 1, is available for exposure. Next, the wafer stage is moved in such a way as to align the center of the reticle pattern directly over the upper left hand corner of the printed 5 x 5 outer box array, wafer position 2100, FIG. 21. The stepper then exposes the image of the small target box onto the resist-coated wafer. If the stepper stage and optical system were truly perfect then the image of the small target box would fit perfectly inside the image of the larger target box, as illustrated in FIGS. 4, and 21, from the previous exposure.--

UNITED STATES PATENT AND TRADEMARK OFFICE
CERTIFICATE OF CORRECTION

PATENT NO. : 7,099,011 B2
APPLICATION NO. : 10/727081
DATED : August 29, 2006
INVENTOR(S) : McArthur et al.

It is certified that error appears in the above-identified patent and that said Letters Patent is hereby corrected as shown below:

IN THE SPECIFICATION

Column 5, lines 1-25, please amend as follows:

--(artifact) with a rectangular array of measurable targets on a stage and measuring the absolute positions of the targets using a tool stage and the tool's image acquisition or alignment system. This measurement process is repeated by reinserting the artifact on the stage but shifted by one target spacing in the X-direction, then repeated again with the artifact inserted on the stage shifted by one target spacing in the Y-direction. Finally, the artifact is inserted at 90-degrees relative to its initial orientation and the target positions measured. The resulting tool measurements are a set of (x, y) absolute positions in the tool's nominal coordinate system. Then, the absolute positions of both targets on the artifact and a mixture of the repeatable and non-repeatable parts of the stage x, y grid error are then determined to within a global translation (Txg, Tyg), rotation (qg) and overall scale ((sxg+syg)/2) factor. This technique is not directly applicable to the present situation since it requires that the measurements be performed on the same machine that is being assessed by this technique. Furthermore, this prior art technique requires measurements made on a tool in absolute coordinates; the metrology tool measures the absolute position of the printed targets relative to ~~it's~~ its own nominal center; so absolute measurements are required over the entire imaging field (typical size >~ 100 mm^2). --

UNITED STATES PATENT AND TRADEMARK OFFICE
CERTIFICATE OF CORRECTION

PATENT NO.         : 7,099,011 B2
APPLICATION NO.    : 10/727081
DATED              : August 29, 2006
INVENTOR(S)        : McArthur et al.

It is certified that error appears in the above-identified patent and that said Letters Patent is hereby corrected as shown below:

IN THE SPECIFICATION

Column 7, lines 41-54, please amend as follows:

--Overlay error is referred to as overlay registration ~~include~~ including, registration error and pattern placement ~~error,~~ error: for our work here, we will simply use the term overlay error or error. For classification purposes, overlay error is typically divided into the following two categories: grid or inter-field and intra-field error. Intra-field error is the overlay error in placement within a projection field, or simply field, of a lithographic projection system. Inter-field error is the overlay error from field to field on the wafer. The physical sources of these errors are generally distinct; inter-field error is due to imaging objective aberrations or possibly scanning dynamics while intra-field errors are due to the wafer alignment system and the wafer stage. The focus of this invention is determination of intra-field error.--

UNITED STATES PATENT AND TRADEMARK OFFICE
CERTIFICATE OF CORRECTION

| | |
|---|---|
| PATENT NO. | : 7,099,011 B2 |
| APPLICATION NO. | : 10/727081 |
| DATED | : August 29, 2006 |
| INVENTOR(S) | : McArthur et al. |

It is certified that error appears in the above-identified patent and that said Letters Patent is hereby corrected as shown below:

IN THE SPECIFICATION

Column 8, lines 1-42 please amend as follows:

--Lithography systems, T. Hasan, et al., IEEE Transactions on Electron Devices, Vol. ED-27, No. 12, 2304:2312, December, 1980; Capacitor Circuit Structure For Determining Overlay Error, K. Tzeng, et al., US Patent 6,143,621, 2000; Overlay Alignment Measurement of Wafers, N. Bareket, US Patent 6,079,256, 2000. The present invention applies to photolithographic steppers, scanners, e-beam systems, EUV and x-ray imaging systems. *See* Mix-And-Match: A necessary Choice, *supra*; Reduction imaging at 14nm using multilayer-coated optics: Printing of features smaller than 0.1 micron, J. Bjorkholm, et al., Journal Vacuum Science and Technology,B 8(6), 1509:1513, Nov/Dec 1990; Development of XUV projection lithography at 60-80 nm, B. Newnam, et al., SPIE vol. 1671, 419:436, 1992; Optical Lithography – Thirty years and three orders of magnitude, J. Bruning, SPIE Vol. 3051, 14:27, 1997. FIG. 28 shows a typical vector plot of overlay error measured with a commercial overlay tool using box-in-box structures. In same cases the overlay error can be measured using special in-situ exposure tool metrology. *See* Matching Management of multiple wafer steppers using a stable standard and a matching simulator, M. Van den Brink, et al., SPIE VOL. 1087, 218:232, 1989. Vector displacement plots like these illustrated in FIG. 28 give a visual description of the direction, magnitude, and location of overlay error, <u>and</u> are mathematically separated into components using a variety of regression routines; FIGS. 28-30 are a schematic of this while ~~See~~ Analysis of overlay distortion patterns. J. Armitage, J. Kirk, SPIE Vol. 921, 207:221, 1988 contains numerous examples. Many commercial software packages exist (Monolith, *See* A Computer Aided Engineering Workstation for registration control, *supra*., Klass II; *See* Lens Matching and Distortion testing in a multi-~~stopper~~ <u>stepper,</u> sub-micron environment, A.Yost, et al., SPIE Vol. 1087, 233:244, 1989) that model and statistically determine the relative magnitude of the systematic and random inter-field and intra-field error components for the purpose of process control and exposure tool set-up. Once the inter-field and intra-field overlay data is analyzed the results are used to adjust the calibration constants and absolute position of the reticle stage, wafer handling stage and projection lens system to improve pattern alignment.--

UNITED STATES PATENT AND TRADEMARK OFFICE
CERTIFICATE OF CORRECTION

| | |
|---|---|
| PATENT NO. | : 7,099,011 B2 |
| APPLICATION NO. | : 10/727081 |
| DATED | : August 29, 2006 |
| INVENTOR(S) | : McArthur et al. |

It is certified that error appears in the above-identified patent and that said Letters Patent is hereby corrected as shown below:

IN THE SPECIFICATION

Column 9, lines 56-57, please amend as follows:

--Then in block 3416 we reconstruct the overlay measurements <u>that</u> are used to produce the lens distortion map.--

Column 12, lines 16-28, please amend as follows:

--In another embodiment, if it is believed or there is evidence that the wafer stage and reticle alignment system are extremely accurate and repeatable (for example if the accuracy and repeatability <~ overlay metrology tool accuracy and repeatability), then all stage positioning and yaw errors $(Tx1,Ty1,q1), \ldots (Tx4,Ty4,q4)$ can be set to zero in equations 5-8. Not solving for the T's and q's allows determining the intra-field distortion uniquely to within an overall translation. That is, a unique solution that includes field rotation, orthogonality, and x and y scale is obtained if the constraints of equation 9 and equation 10 through equations 14 and 15 are imposed and then calculate $(dxf, dyf)$ using the resulting $Tx, Ty$ values and setting $q=qo=sx=sy=0$ in equations 20 and 21.--

UNITED STATES PATENT AND TRADEMARK OFFICE
CERTIFICATE OF CORRECTION

| | |
|---|---|
| PATENT NO. | : 7,099,011 B2 |
| APPLICATION NO. | : 10/727081 |
| DATED | : August 29, 2006 |
| INVENTOR(S) | : McArthur et al. |

It is certified that error appears in the above-identified patent and that said Letters Patent is hereby corrected as shown below:

IN THE SPECIFICATION

Column 16, lines 63-67, please amend as follows:

--With regard to error multipliers, the effect of including the R-shears in these calculations is to further reduce the error multipliers from the X, Y shear case since including more measurements increases the averaging of overlay metrology tool noise and thereby decreases ~~it's~~ its influence.--

Column 17, lines 7-20, please amend as follows:

--In another embodiment, if ~~its~~ it is believed, or there is evidence, that the wafer stage and reticle alignment system are extremely accurate and repeatable, for example if the accuracy and repeatability <~ overlay metrology tool accuracy / repeatability, then all stage positioning and yaw errors (Tx1,Ty1,ql), . . .(Tx6,Ty6,q6) can be set to zero in equations 27-32. Not solving for the T's and q's allows determining the intra-field distortion uniquely to within an overall translation. That is, a unique solution is obtained that includes field rotation and overall scale if the constraints of equation 33 and equation 34 through equations 37 and 38 are imposed and then calculate (dxf, dyf) using the resulting Tx, Ty values and setting q=s=0 in equations 41 and 42.--

UNITED STATES PATENT AND TRADEMARK OFFICE
CERTIFICATE OF CORRECTION

PATENT NO. : 7,099,011 B2
APPLICATION NO. : 10/727081
DATED : August 29, 2006
INVENTOR(S) : McArthur et al.

It is certified that error appears in the above-identified patent and that said Letters Patent is hereby corrected as shown below:

IN THE SPECIFICATION

Column 18, lines 28-53, please amend as follows:

--A variation of the first two embodiments that allows the user to extract the repeatable part of the intra-field distortion with a minimum number of exposed fields and overlay metrology is described. Below, $E_o$ is the E-zero or minimum exposure dose required for a large, i.e. 200 micron at wafer, open area pattern on the reticle to become fully developed, or cleared in the case of positive resist. FIG. 34A illustrates a process flow diagram where in blocks 3442, 3444 and 3446, the overlay target reticle and resist coated wafer are loaded into the projection imaging tool, or machine, as described above. Next in blocks 3448 and 3450, instead of exposing each field with a single scanning or exposing action, the machine is programmed to expose each field at a multiplicity of lower doses. So if $a*E_o$ ($a > 1$) is the required dose at the wafer to completely expose a single field with a single exposing action, we expose the field N times at a dose of $a*E_o/N$, where N is same predetermined number, typically 20. Within these N exposures the wafer stage is not moved to another field position, a single field is exposed N times. In the preferred embodiment, this process is repeated 3 more times for the other fields. The result of this procedure is to average out the scanning non-repeatability by an amount proportional to N (parameterized as $b*M$). The exact configuration of the resist (novolac, chemically amplified, resist manufacturer, processing conditions) determines whether $b = 1$ or is $< 1$.--

UNITED STATES PATENT AND TRADEMARK OFFICE
CERTIFICATE OF CORRECTION

| | | |
|---|---|---|
| PATENT NO. | : 7,099,011 B2 | Page 8 of 9 |
| APPLICATION NO. | : 10/727081 | |
| DATED | : August 29, 2006 | |
| INVENTOR(S) | : McArthur et al. | |

It is certified that error appears in the above-identified patent and that said Letters Patent is hereby corrected as shown below:

IN THE SPECIFICATION

Column 18, lines 56-67, please amend as follows:

--Then in blocks 3452, 3454, and 3456 the wafer is developed and the overlay targets ~~and~~ are measured and a lens distortion map constructed as described above in connection with FIG. 34.

In another variation of the first two embodiments, multiple exposing actions are performed to average out the effect of non-repeatability. but now the overlay reticle, for example the reticle of FIG. 20, has a partially reflecting dielectric coating either on ~~it's~~ its non-chrome or possibly chrome coated (machine optical object plane) surface see FIG. 20C. For --

IN THE SPECIFICATION

Column 19, lines 40-57, please amend as follows:

--The techniques described above have been mainly described with respect to alignment attributes that are in the form of a box in box or frame in frame pattern as shown in FIG. 14. Other alignment attributes such as gratings <u>can be used.</u> *See* U.S. Pat. No. 6,079,256 - Overlay Alignment Measurement of Wafer, *supra*, and FIG. 1b, wafer alignment marks. *See* Matching Management of multiple wafer steppers using a stable standard and a matching simulator, *supra*, van der Pauw resistors. *See* Automated Electrical Measurements of Registration Errors in Step and Repeat Optical Lithography systems, *supra*, vernier pairs; *See* Method of Measuring Bias and Edge overlay error for sub 0.5 micron Ground Rules, C. Ausschnitt, et al., U.S. Pat. No. 5,757,507 (1998), capacitor structures. *See* Capacitor Circuit Structor For Determining Overlay Error, *supra* could be used instead. In general, any alignment attribute that can be used by an overlay metrology tool for measuring offsets can be utilized by the techniques described.--

UNITED STATES PATENT AND TRADEMARK OFFICE
CERTIFICATE OF CORRECTION

PATENT NO. : 7,099,011 B2
APPLICATION NO. : 10/727081
DATED : August 29, 2006
INVENTOR(S) : McArthur et al.

It is certified that error appears in the above-identified patent and that said Letters Patent is hereby corrected as shown below:

IN THE SPECIFICATION

Column 25, line 51 to column 26, line 20, please amend as follows:

--The techniques have been mainly described with respect to ~~it's~~ their application on the projection imaging tools such as photolithographic stepper ~~systems~~ systems. *See* Direct-referencing automatic two-points reticle-to-~~wafter~~ wafer alignment using a projection column servo system, *supra;* New 0.54 Aperture I-Line Wafer Stepper With Field by Field Leveling Combined with Global Alignment, M. Van den Brink, B. Katz, S. Wittekoek, SPIE Vol. 1463, 709:724, 1991; Projection optical system for use in precise copy, T. Sato, et al., U.S. Pat. No. 4,861,148, 1989, and photolithographic scanners systems. *See* Micrascan (TM) III performance of a third generation, catadioptric step and scan lithographic tool, D. Cote, et al., SPIE Vol. 3051, 806:816, 1997; ArF Step And Scan Exposure System For 0.15 Micron and 0.13 micron Technology Node, J. Mulkens, et al., SPIE Conference on Optical Microlithography XII, 506:521, March, 1999; 0.7 NA DUV step and Scan system for 150nm Imaging with Improved Overlay, supra ~~supra~~]) most commonly used in semiconductor manufacturing today. The techniques can be applied to other projection imaging tools such as contact or proximity printers. *See* Optical Lithography--Thirty years and three orders of magnitude, *supra*, 2-dimensional scanners; *See* Large-area, High-throughout, High Resolution Projection Imaging System, K. Jain, U.S. Pat. No. 5,285,236, 1994, Optical Lithography--Thirty years and three orders of magnitude, *supra*, office copy machines, and next generation lithography (ngl) systems such as XUV. *See* Development of XUV projection lithography at 60-80 nm, *supra*, SCALPEL, EUV (Extreme Ultra Violet); *See* Reduction imaging at 14nm using multilayer-coated optics: Printing of features smaller than 0.1 micron ef 53, *supra*, IPL (Ion Projection Lithography), and EPL (electron projection lithography). *See* Mix-And-Match: A necessary Choice, *supra*. In addition, the techniques can be applied to a lithographic projection system used in an electron beam imaging system, or a direct write tool, or an x-ray imaging system.--

Signed and Sealed this

Nineteenth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 7,099,011 B2
APPLICATION NO. : 10/727018
DATED : August 29, 2006
INVENTOR(S) : McArthur et al.

It is certified that error appears in the above-identified patent and that said Letters Patent is hereby corrected as shown below:

IN THE SPECIFICATION

Column 3, line 32 to column 4, line 4, please amend as follows:

--Semiconductor manufacturing facilities generally use some version of the following complex overlay procedure to help determine the magnitude of lens distortion independent of other sources of systematic overlay error. The technique has been simplified for illustration. *See* Analysis of image field placement deviations of a 5x microlithographic reduction lens, D. MacMillan, et al., SPIE Vol. 334, 78:89, 1982. FIGS. 2 and 3 show typical sets of overlay targets 300, including – one large or outer box 302 and one small or inner target box 304. FIG. 1 shows a typical portion of a distortion test reticle 102 used in the prior art. It should be noted that the chrome target patterns on most reticles are 4 or 5 times larger as compared with the patterns they produce at the image ~~plane,~~ plane; this simply means modem steppers are reduction systems. Further, for purposes of discussion, it is assumed that the reticle pattern is geometrically perfect, (in practice, the absolute positions of features on the reticle can be measured and the resulting errors subtracted off). First, a wafer covered with photoresist is loaded onto the wafer stage and globally aligned. Next, the full-field image of the reticle, 102 in FIG. 1 is exposed onto the resist-coated wafer 2102 in FIG. 21. For purposes of illustration, we assume that the distortion test reticle consists of a 5 x 5 array of outer boxes evenly spaced a distance M*P, across the reticle surface see FIG. 1. It is typically assumed that the center of the optical system is virtually aberration free. *See* Analysis of image field placement deviations of a 5x microlithographic reduction lens, *supra*. With this assumption, the reticle, 102 in FIG. 1 is now partially covered using the reticle blades, 1704 in FIG. 17, in such a way that only a single target at the center of the reticle field, box 104, in FIG. 1, is available for exposure. Next, the wafer stage is moved in such a way as to align the center of the reticle pattern directly over the upper left hand corner of the printed 5 x 5 outer box array, wafer position 2100, FIG. 21. The stepper then exposes the image of the small target box onto the resist-coated wafer. If the stepper stage and optical system were truly perfect then the image of the small target box would fit perfectly inside the image of the larger target box, as illustrated in FIGS. 4, and 21, from the previous exposure.--

UNITED STATES PATENT AND TRADEMARK OFFICE
CERTIFICATE OF CORRECTION

| | |
|---|---|
| PATENT NO. | : 7,099,011 B2 |
| APPLICATION NO. | : 10/727018 |
| DATED | : August 29, 2006 |
| INVENTOR(S) | : McArthur et al. |

It is certified that error appears in the above-identified patent and that said Letters Patent is hereby corrected as shown below:

IN THE SPECIFICATION

Column 5, lines 1-25, please amend as follows:

--(artifact) with a rectangular array of measurable targets on a stage and measuring the absolute positions of the targets using a tool stage and the tool's image acquisition or alignment system. This measurement process is repeated by reinserting the artifact on the stage but shifted by one target spacing in the X-direction, then repeated again with the artifact inserted on the stage shifted by one target spacing in the Y-direction. Finally, the artifact is inserted at 90-degrees relative to its initial orientation and the target positions measured. The resulting tool measurements are a set of (x, y) absolute positions in the tool's nominal coordinate system. Then, the absolute positions of both targets on the artifact and a mixture of the repeatable and non-repeatable parts of the stage x, y grid error are then determined to within a global translation (Txg, Tyg), rotation (qg) and overall scale ((sxg+syg)/2) factor. This technique is not directly applicable to the present situation since it requires that the measurements be performed on the same machine that is being assessed by this technique. Furthermore, this prior art technique requires measurements made on a tool in absolute coordinates; the metrology tool measures the absolute position of the printed targets relative to ~~it's~~ its own nominal center; so absolute measurements are required over the entire imaging field (typical size $>\sim 100$ mm^2). --

UNITED STATES PATENT AND TRADEMARK OFFICE
CERTIFICATE OF CORRECTION

PATENT NO. : 7,099,011 B2
APPLICATION NO. : 10/727018
DATED : August 29, 2006
INVENTOR(S) : McArthur et al.

It is certified that error appears in the above-identified patent and that said Letters Patent is hereby corrected as shown below:

IN THE SPECIFICATION

Column 7, lines 41-54, please amend as follows:

--Overlay error is referred to as overlay registration ~~include~~ including, registration error and pattern placement ~~error,~~ error: for our work here, we will simply use the term overlay error or error. For classification purposes, overlay error is typically divided into the following two categories: grid or inter-field and intra-field error. Intra-field error is the overlay error in placement within a projection field, or simply field, of a lithographic projection system. Inter-field error is the overlay error from field to field on the wafer. The physical sources of these errors are generally distinct; inter-field error is due to imaging objective aberrations or possibly scanning dynamics while intra-field errors are due to the wafer alignment system and the wafer stage. The focus of this invention is determination of intra-field error.--

UNITED STATES PATENT AND TRADEMARK OFFICE
CERTIFICATE OF CORRECTION

PATENT NO. : 7,099,011 B2
APPLICATION NO. : 10/727018
DATED : August 29, 2006
INVENTOR(S) : McArthur et al.

It is certified that error appears in the above-identified patent and that said Letters Patent is hereby corrected as shown below:

IN THE SPECIFICATION

Column 8, lines 1-42 please amend as follows:

--Lithography systems, T. Hasan, et al., IEEE Transactions on Electron Devices, Vol. ED-27, No. 12, 2304:2312, December, 1980; Capacitor Circuit Structure For Determining Overlay Error, K. Tzeng, et al., US Patent 6,143,621, 2000; Overlay Alignment Measurement of Wafers, N. Bareket, US Patent 6,079,256, 2000. The present invention applies to photolithographic steppers, scanners, e-beam systems, EUV and x-ray imaging systems. *See* Mix-And-Match: A necessary Choice, *supra*; Reduction imaging at 14nm using multilayer-coated optics: Printing of features smaller than 0.1 micron, J. Bjorkholm, et al., Journal Vacuum Science and Technology,B 8(6), 1509:1513, Nov/Dec 1990; Development of XUV projection lithography at 60-80 nm, B. Newnam, et al., SPIE vol. 1671, 419:436, 1992; Optical Lithography – Thirty years and three orders of magnitude, J. Bruning, SPIE Vol. 3051, 14:27, 1997. FIG. 28 shows a typical vector plot of overlay error measured with a commercial overlay tool using box-in-box structures. In same cases the overlay error can be measured using special in-situ exposure tool metrology. *See* Matching Management of multiple wafer steppers using a stable standard and a matching simulator, M. Van den Brink, et al., SPIE VOL. 1087, 218:232, 1989. Vector displacement plots like these illustrated in FIG. 28 give a visual description of the direction, magnitude, and location of overlay error, <u>and</u> are mathematically separated into components using a variety of regression routines; FIGS. 28-30 are a schematic of this while ~~See~~ Analysis of overlay distortion patterns. J. Armitage, J. Kirk, SPIE Vol. 921, 207:221, 1988 contains numerous examples. Many commercial software packages exist (Monolith, *See* A Computer Aided Engineering Workstation for registration control, *supra*., Klass II; *See* Lens Matching and Distortion testing in a multi-~~stopper~~ <u>stepper,</u> sub-micron environment, A.Yost, et al., SPIE Vol. 1087, 233:244, 1989) that model and statistically determine the relative magnitude of the systematic and random inter-field and intra-field error components for the purpose of process control and exposure tool set-up. Once the inter-field and intra-field overlay data is analyzed the results are used to adjust the calibration constants and absolute position of the reticle stage, wafer handling stage and projection lens system to improve pattern alignment.--

UNITED STATES PATENT AND TRADEMARK OFFICE
CERTIFICATE OF CORRECTION

| | | |
|---|---|---|
| PATENT NO. | : 7,099,011 B2 | |
| APPLICATION NO. | : 10/727018 | |
| DATED | : August 29, 2006 | |
| INVENTOR(S) | : McArthur et al. | |

It is certified that error appears in the above-identified patent and that said Letters Patent is hereby corrected as shown below:

IN THE SPECIFICATION

Column 9, lines 56-57, please amend as follows:

--Then in block 3416 we reconstruct the overlay measurements that are used to produce the lens distortion map.--

Column 12, lines 16-28, please amend as follows:

--In another embodiment, if it is believed or there is evidence that the wafer stage and reticle alignment system are extremely accurate and repeatable (for example if the accuracy and repeatability <~ overlay metrology tool accuracy and repeatability), then all stage positioning and yaw errors (Tx1,Ty1,q1), . . .(Tx4,Ty4,q4) can be set to zero in equations 5-8. Not solving for the T's and q's allows determining the intra-field distortion uniquely to within an overall translation. That is, a unique solution that includes field rotation, orthogonality, and x and y scale is obtained if the constraints of equation 9 and equation 10 through equations 14 and 15 are imposed and then calculate (dxf, dyf) using the resulting Tx, Ty values and setting q=qo=sx=sy=0 in equations 20 and 21.--

UNITED STATES PATENT AND TRADEMARK OFFICE
CERTIFICATE OF CORRECTION

PATENT NO. : 7,099,011 B2
APPLICATION NO. : 10/727018
DATED : August 29, 2006
INVENTOR(S) : McArthur et al.

It is certified that error appears in the above-identified patent and that said Letters Patent is hereby corrected as shown below:

IN THE SPECIFICATION

Column 16, lines 63-67, please amend as follows:

--With regard to error multipliers, the effect of including the R-shears in these calculations is to further reduce the error multipliers from the X, Y shear case since including more measurements increases the averaging of overlay metrology tool noise and thereby decreases ~~it's~~ its influence.--

Column 17, lines 7-20, please amend as follows:

--In another embodiment, if ~~its~~ it is believed, or there is evidence, that the wafer stage and reticle alignment system are extremely accurate and repeatable, for example if the accuracy and repeatability $<\sim$ overlay metrology tool accuracy / repeatability, then all stage positioning and yaw errors $(Tx1, Ty1, ql), \ldots (Tx6, Ty6, q6)$ can be set to zero in equations 27-32. Not solving for the T's and q's allows determining the intra-field distortion uniquely to within an overall translation. That is, a unique solution is obtained that includes field rotation and overall scale if the constraints of equation 33 and equation 34 through equations 37 and 38 are imposed and then calculate (dxf, dyf) using the resulting Tx, Ty values and setting $q=s=0$ in equations 41 and 42.--

UNITED STATES PATENT AND TRADEMARK OFFICE
CERTIFICATE OF CORRECTION

PATENT NO. : 7,099,011 B2
APPLICATION NO. : 10/727018
DATED : August 29, 2006
INVENTOR(S) : McArthur et al.

It is certified that error appears in the above-identified patent and that said Letters Patent is hereby corrected as shown below:

IN THE SPECIFICATION

Column 18, lines 28-53, please amend as follows:

--A variation of the first two embodiments that allows the user to extract the repeatable part of the intra-field distortion with a minimum number of exposed fields and overlay metrology is described. Below, Eo is the E-zero or minimum exposure dose required for a large, i.e. 200 micron at wafer, open area pattern on the reticle to become fully developed, or cleared in the case of positive resist. FIG. 34A illustrates a process flow diagram where in blocks 3442, 3444 and 3446, the overlay target reticle and resist coated wafer are loaded into the projection imaging tool, or machine, as described above. Next in blocks 3448 and 3450, instead of exposing each field with a single scanning or exposing action, the machine is programmed to expose each field at a multiplicity of lower doses. So if a*Eo (a >1) is the required dose at the wafer to completely expose a single field with a single exposing action, we expose the field N times at a dose of a*Eo/N, where N is same predetermined number, typically 20. Within these N exposures the wafer stage is not moved to another field position, a single field is exposed N times. In the preferred embodiment, this process is repeated 3 more times for the other fields. The result of this procedure is to average out the scanning non-repeatability by an amount proportional to N (parameterized as b*M). The exact configuration of the resist (novolac, chemically amplified, resist manufacturer, processing conditions) determines whether b =1 or is < 1.--

UNITED STATES PATENT AND TRADEMARK OFFICE
CERTIFICATE OF CORRECTION

| | |
|---|---|
| PATENT NO. | : 7,099,011 B2 |
| APPLICATION NO. | : 10/727018 |
| DATED | : August 29, 2006 |
| INVENTOR(S) | : McArthur et al. |

It is certified that error appears in the above-identified patent and that said Letters Patent is hereby corrected as shown below:

IN THE SPECIFICATION

Column 18, lines 56-67, please amend as follows:

--Then in blocks 3452, 3454, and 3456 the wafer is developed and the overlay targets ~~and~~ are measured and a lens distortion map constructed as described above in connection with FIG. 34.

In another variation of the first two embodiments, multiple exposing actions are performed to average out the effect of non-repeatability. but now the overlay reticle, for example the reticle of FIG. 20, has a partially reflecting dielectric coating either on ~~it's~~ its non-chrome or possibly chrome coated (machine optical object plane) surface see FIG. 20C. For --

IN THE SPECIFICATION

Column 19, lines 40-57, please amend as follows:

--The techniques described above have been mainly described with respect to alignment attributes that are in the form of a box in box or frame in frame pattern as shown in FIG. 14. Other alignment attributes such as gratings <u>can be used.</u> *See* U.S. Pat. No. 6,079,256 - Overlay Alignment Measurement of Wafer, *supra*, and FIG. 1b, wafer alignment marks. *See* Matching Management of multiple wafer steppers using a stable standard and a matching simulator, *supra*, van der Pauw resistors. *See* Automated Electrical Measurements of Registration Errors in Step and Repeat Optical Lithography systems, *supra*, vernier pairs; *See* Method of Measuring Bias and Edge overlay error for sub 0.5 micron Ground Rules, C. Ausschnitt, et al., U.S. Pat. No. 5,757,507 (1998), capacitor structures. *See* Capacitor Circuit Structor For Determining Overlay Error, *supra* could be used instead. In general, any alignment attribute that can be used by an overlay metrology tool for measuring offsets can be utilized by the techniques described.--

UNITED STATES PATENT AND TRADEMARK OFFICE
CERTIFICATE OF CORRECTION

PATENT NO. : 7,099,011 B2
APPLICATION NO. : 10/727018
DATED : August 29, 2006
INVENTOR(S) : McArthur et al.

It is certified that error appears in the above-identified patent and that said Letters Patent is hereby corrected as shown below:

IN THE SPECIFICATION

Column 25, line 51 to column 26, line 20, please amend as follows:

--The techniques have been mainly described with respect to ~~it's~~ their application on the projection imaging tools such as photolithographic stepper ~~systems~~ systems. *See* Direct-referencing automatic two-points reticle-to-~~wafter~~ wafer alignment using a projection column servo system, *supra;* New 0.54 Aperture I-Line Wafer Stepper With Field by Field Leveling Combined with Global Alignment, M. Van den Brink, B. Katz, S. Wittekoek, SPIE Vol. 1463, 709:724, 1991*;* Projection optical system for use in precise copy, T. Sato, et al., U.S. Pat. No. 4,861,148, 1989, and photolithographic scanners systems. *See* Micrascan (TM) III performance of a third generation, catadioptric step and scan lithographic tool, D. Cote, et al., SPIE Vol. 3051, 806:816, 1997; ArF Step And Scan Exposure System For 0.15 Micron and 0.13 micron Technology Node, J. Mulkens, et al., SPIE Conference on Optical Microlithography XII, 506:521, March, 1999*;* 0.7 NA DUV step and Scan system for 150nm Imaging with Improved Overlay, supra ~~supra~~]) most commonly used in semiconductor manufacturing today. The techniques can be applied to other projection imaging tools such as contact or proximity printers. *See* Optical Lithography--Thirty years and three orders of magnitude, *supra*, 2-dimensional scanners; *See* Large-area, High-throughout, High Resolution Projection Imaging System, K. Jain, U.S. Pat. No. 5,285,236, 1994, Optical Lithography--Thirty years and three orders of magnitude, *supra*, office copy machines, and next generation lithography (ngl) systems such as XUV. *See* Development of XUV projection lithography at 60-80 nm, *supra*, SCALPEL, EUV (Extreme Ultra Violet); *See* Reduction imaging at 14nm using multilayer-coated optics: Printing of features smaller than 0.1 micron ef 53, *supra*, IPL (Ion Projection Lithography), and EPL (electron projection lithography). *See* Mix-And-Match: A necessary Choice, *supra*. In addition, the techniques can be applied to a lithographic projection system used in an electron beam imaging system, or a direct write tool, or an x-ray imaging system.--

UNITED STATES PATENT AND TRADEMARK OFFICE
CERTIFICATE OF CORRECTION

PATENT NO. : 7,099,011 B2
APPLICATION NO. : 10/727018
DATED : August 29, 2006
INVENTOR(S) : McArthur et al.

It is certified that error appears in the above-identified patent and that said Letters Patent is hereby corrected as shown below:

This certificate supersedes Certificate of Correction issued on December 19, 2006.

Signed and Sealed this

Sixth Day of February, 2007

JON W. DUDAS
*Director of the United States Patent and Trademark Office*